(12) United States Patent  
Uchiyama

(10) Patent No.: US 6,489,197 B2  
(45) Date of Patent: Dec. 3, 2002

(54) SEMICONDUCTOR MEMORY DEVICE AND METHOD OF FABRICATING THE SAME

(75) Inventor: Shirou Uchiyama, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/801,289

(22) Filed: Mar. 7, 2001

(65) Prior Publication Data

US 2001/0041404 A1 Nov. 15, 2001

(30) Foreign Application Priority Data

Mar. 8, 2000 (JP) .................................... 2000-064213

(51) Int. Cl.$^7$ ............................................ H01L 21/8242
(52) U.S. Cl. ....................................... 438/253; 257/306
(58) Field of Search ............................ 438/253, 301, 438/586, 624, 702, 396, 459, 977, 238–239, 241, 258; 257/306–310, 298, 532

(56) References Cited

U.S. PATENT DOCUMENTS

| | | | | |
|---|---|---|---|---|
| 5,554,870 A | * | 9/1996 | Fitch et al. | 257/329 |
| 5,621,247 A | * | 4/1997 | Hirao et al. | 257/763 |
| 5,663,092 A | * | 9/1997 | Lee | 438/253 |
| 5,793,076 A | * | 8/1998 | Fazan et al. | 257/298 |
| 6,255,160 B1 | * | 7/2001 | Huang | 438/238 |
| 6,297,090 B1 | * | 10/2001 | Kim | 438/253 |
| 6,410,948 B1 | * | 6/2002 | Tran et al. | 257/201 |

FOREIGN PATENT DOCUMENTS

| JP | 10-22483 | 1/1998 |
|---|---|---|
| JP | 10-189910 | 7/1998 |

* cited by examiner

*Primary Examiner*—David Nelms  
*Assistant Examiner*—David Vu  
(74) *Attorney, Agent, or Firm*—Dickstein, Shapiro, Morin & Oshinsky, LLP

(57) ABSTRACT

A semiconductor memory device is provided, which prevents electrical short-circuit between the wiring lines (e.g., the bit lines) and the contact pads for electrically connecting the lower capacitor electrodes. The first conauctive pads are formed to fill the respective contact holes of the first interlayer dielectric film in such a way that the tops of the first pads are lower than the surface of the first interlayer dielectric film. Thus, the gaps are formed on the tops of the first pads in the respective contact holes. The wiring (or conductive) lines, the top faces and side faces of which are covered with the dielectric, are formed on the surface of the first interlayer dielectric film. The wiring lines of the first group are electrically connected to the first conductive pads. The wiring lines of the second group are apart from the respective first conductive pads, thereby electrically insulating the wiring lines of the second group from the first conductive pads.

9 Claims, 17 Drawing Sheets

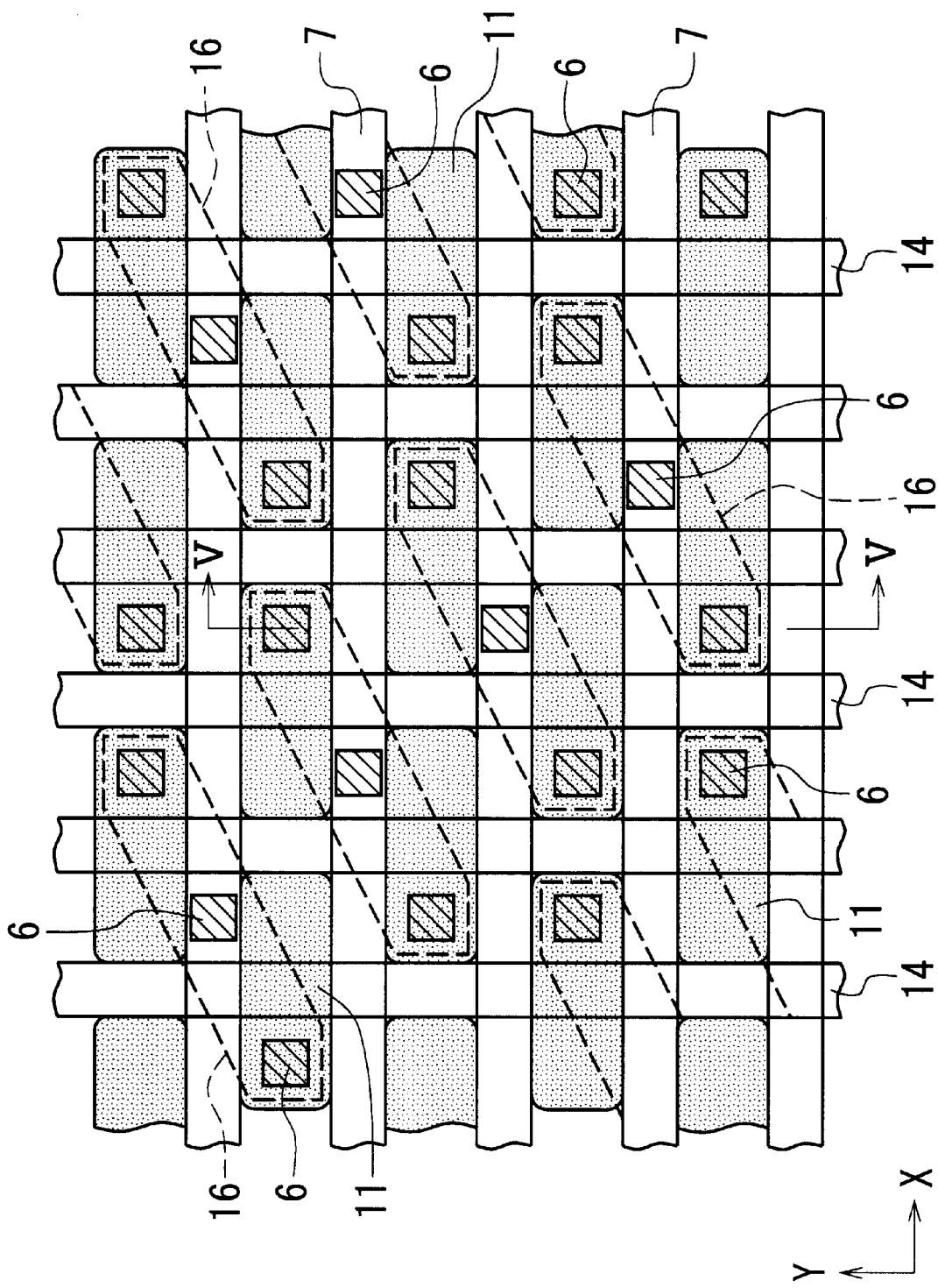

SEMICONDUCTOR MEMORY DEVICE AND METHOD OF FABRICATING THE SAME

BACKGROUND OF THE INVENTION

1. Field of the Invention

The present invention relates to the technique relating to a semiconductor memory device and more particularly, to a semiconductor memory device (e.g., a Dynamic Random-Access Memory, a DRAM) with the so-called cylindrical capacitor structure, and a method of fabricating the device.

2. Description of the Related Art

Recently, the tendency to decrease the memory cell size or area has been progressing with the increasing storage capacity and the rising integration-scale or density. In particular, with the storage cell of DRAMS, the two-dimensional size of the storage capacitor for storing electric charge needs to be decreased without reducing the essential capacitance value of each storage cell for normal operation. Thus, to meet this need, various three-dimensional capacitor structures (e.g., the cylindrical stacked capacitor, fin-like stacked capacitor, and so forth) have ever been developed and some of them have been actually applied to manufacture. Some examples of them are disclosed in the Japanese Non-Examined Patent Publication Nos. 10-189910 published in July 1988 and 10-22483 published in January 1998.

With the conventional DRAMS of this type, the conductive contact pads in the storage cells are formed to fill the contact holes in an interlayer dielectric layer according to the minimum design rule. Thus, it has become difficult to form stably a patterned photoresist film for the contact pad. Also, due to the reduction of the alignment margin, electrical short-circuit tends to occur between the wiring lines and the storage capacitors.

An example of the conventional methods of fabricating the DRAM with the cylindrical stacked capacitor structure is explained below with reference to FIGS. 1 and FIGS. 2A to 2D.

The conventional DRAM has a typical configuration shown in FIG. 1, which includes active areas 116 formed in a semiconductor substrate 101. The areas 116 are arranged regularly in the substrate 101. Two Metal-Oxide-Semiconductor Field-Effect Transistors (MOSFETs, not shown) are formed in each of the areas 116. Bit lines 107 and gate electrodes 114 of the MOSFETS are arranged in a matrix array over the substrate 101. The gate electrodes 114 are formed to be consecutive and serve as word lines. The bit lines 107 extend in the X direction while the gate electrodes (i.e., word lines) 114 extend in the Y direction.

Each of the active areas 116 includes two source regions and a common drain region of the two adjoining MOSFETs. The common drain region is electrically connected to the overlying, corresponding bit line 107 by way of a conductive contact pad 106.

Each of the two source regions is electrically connected to the overlying, lower electrode of the corresponding storage capacitor by way of the corresponding contact pad 106. The lower electrode has an approximately rectangular pattern (i.e., the plan shape), as shown in FIG. 1.

The conventional DRAM having the configuration shown in FIG. 1 is fabricated in the following way.

First, as shown in FIG. 2A, an isolation dielectric 102 is selectively formed in the substrate 101 by the known Shallow Trench Isolation (STI) method, forming the active areas 116. A specific impurity is selectively ion-implanted into the areas 116, forming the diffusion regions (e.g., source/drain regions) 103. Thereafter, MOSFETs are formed in the areas 116 using the regions 103 through known processes.

Subsequently, a first interlayer dielectric film 104, which is made of, for example, a borophosphor silicate glass (RPSG), is deposited over the whole substrate 101 and then, the surface of the film 104 is planarized by the chemical-mechanical polishing (CMP) method. After a patterned photoresist film (not shown) is formed on the film 104 thus planarized, the film 104 is selectively etched using the photoresist film as a mask. Thus, contact holes 105 for the conductive contact pads 106 are formed over the diffusion regions 103 which will be electrically connected to the overlying bit lines 107 and the overlying lower capacitor electrodes.

Following this, a polysilicon film (not shown) is formed on the first interlayer dielectric film 104 and etched back by a dry etching process, thereby forming polysilicon contact pads 106 to fill the respective holes 105. The state at this stage is shown in FIG. 2A.

Next, the bit line 107 are formed on the first interlayer dielectric film 104, as shown in FIG. 2B. Specifically, a tungsten polycide film and a silicon nitride film (both of which are not shown) are successively deposited on the film 104 and then, they are selectively etched by dry etching processes using the same patterned photoresist film as a mask. Thus, the bit lines 107 are formed on the film 104 by the remaining tungsten polycide film while dielectric caps 108 are formed on the tops of the lines 107 by the remaining silicon nitride film.

The bit line 107 located at approximately the middle in FIG. 2B is contacted with the underlying polysilicon contact pad 106. Unlike this, the bit lines 107 located at the left and right sides in FIG. 2B are slightly contacted with the underlying contact pads 106, respectively. This is undesired contact.

A silicon nitride film (not shown) is deposited on the first interlayer dielectric film 104 to cover the bit lines 107 with the caps 108. The silicon nitride film is then etched back by a dry etching process, forming sidewalls 109 at each side of each bit line 107, as shown in FIG. 2C. Thus, the top and both sides of each line 107 are entirely covered with silicon nitride. The state at this stage is shown in FIG. 2C.

A second interlayer dielectric film 110, which is thicker than the first interlayer dielectric film 104, is deposited on the film 104 over the whole substrate 101 to cover the bit lines 107 with the caps 108 and the sidewalls 109. The surface of the film 110 is then planarized by a CMP process. A patterned photoresist film (not shown) is formed on the film 110 and then, the film 110 is selectively etched by a dry etching process, thereby forming openings 111 in the film 110 for the lower capacitor electrodes. As shown in FIG. 1, the openings 111 are approximately rectangular in plan shape. This dry etching process is performed under the condition that the etch selectivity is sufficiently high between BPSG (i.e., the film 110) and silicon nitride (i.e., the caps 108 and the sidewalls 109). For example, a gaseous mixture of $CHF_3$ and CO is used for this purpose.

Thereafter, a polysilicon film (not shown) is deposited on the interlayer dielectric film 110 to extend along the inner walls of the openings 111. Using a patterned photoresist film as a mask, the polysilicon film thus deposited is selectively etched by a dry etching process, forming the lower electrodes of the capacitors.

With the above-mentioned method of fabricating the conventional DRAM with reference to FIGS. 2A to 2D, there are the following problems.

The first problem is that electrical short-circuit tends to occur between the contact pad 106 in each opening 111 and the adjoining bit line 107. This is because the contact holes 105 in the first interlayer dielectric layer 104 are formed according to the minimum design rule and therefore, the alignment margin is extremely small between the opening 111 and the line 107.

As shown in FIG. 2D, the bottoms of the bit lines 107 located at approximately the left and right sides are in undesired contact with the tops of the respective contact pads 106.

The second problem is that the bit lines 107 tend to be undesirably etched in the dry etching process of forming the openings 111 in the second interlayer dielectric film 110 due to the reason described below.

The width of the bit line 107 may be decreased to avoid the first problem. In this case, however, the surface areas of the caps 108 and the sidewalls 109 (both of which are made of silicon nitride) decrease, resulting in an etch rate increase of the caps 108 and the sidewalls 109. In this way, the etch resistance of the caps 108 and the sidewalls 109 deteriorates. This leads to unwanted exposure of the bit lines 107 from the caps 108 and/or the sidewalls 109, contacting the lines 107 with the lower capacitor electrodes.

To solve the above-described first and second problem, an improved method has been developed, which is explained below with reference to FIGS. 3A to 3D.

First, the structure as shown in FIG. 3A is formed in the same way as explained in the above-described conventional method. The structure in FIG. 3A is the same as that shown in FIG. 2A.

Thereafter, as shown in FIG. 3B, an additional interlayer dielectric film 217 is deposited on the first interlayer dielectric film 104 over the whole substrate 101. Next, the film 217 is selectively etched to form a contact hole 217a located just over the contact pad 106 to be connected to the overlying bit line 107. The hole 217a is filled with a polysilicon contact pad 218.

The subsequent process steps are carried out in the same way as explained in the above-described conventional method.

Specifically, shown in FIG. 3B, the bit lines 107 are formed on the additional interlayer dielectric film 217 by the patterned tungsten polycide film while the dielectric caps 108 are formed on the lines 107 by the patterned silicon nitride film. Thereafter, the sidewalls 109 are formed by the silicon nitride film at each side of the bit lines 107, as shown in FIG. 3C.

The bit lines 107 located at the middle in FIG. 3B is electrically connected to the underlying polysilicon contact pad 106 by way of the contact pad 218. Unlike this, the bit lines 107 located at the left and right sides in FIG. 3B are separated from the underlying polysilcon contact pads 106 by the additional interlayer dielectric film 217.

The thick second interlayer dielectric film 110 is formed on the additional interlayer dielectric film 217 to cover the bit lines 107 with the caps 108 and the sidewalls 109 and then, the surface of the film 110 is planarized. The film 110 is selectively etched to form the openings 111 in the film 110 for the lower capacitor electrodes. Thereafter, the lower capacitor electrodes are formed in the openings 111 by the polysilicon film.

With the above-described improved method shown in FIGS. 3A to 3D, the above-described first problem can be solved. However, there arise another problem that the number of necessary process steps increases. For example, the steps of depositing the additional interlayer dielectric film 217, forming a pattered photoresist film, selectively etching the film 217 at the position just below the desired bit line 107 to form the contact hole 217a, and removing the pattered photoresist film are additionally required.

SUMMARY OF THE INVENTION

Accordingly, an object of the present invention is to provide a semiconductor memory device that prevents the electrical short-circuit between the conductive contact pads electrically connected to the lower capacitor electrodes and the wiring lines (e.g., the bit lines), and a method of fabricating the device.

Another object of the present invention is to provide a semiconductor memory device that prevents undesired etching of the wiring lines (e.g., the bit lines) when the interlayer dielectric layer is selectively etched to form the contact holes for the lower capacitor electrodes, and a method of fabricating the device.

Still another object of the present invention is to provide a semiconductor memory device that increases the alignment margin between the conductive contact pads electrically connected to the lower capacitor electrodes and the wiring lines (e.g., the bit lines), and a method of fabricating the device.

A further object of the present invention is to provide a semiconductor memory device that makes it unnecessary to reduce the width of the wiring lines (e.g., the bit lines) for higher integration, and a method of fabricating the device.

A still further object of the present invention is to provide a semiconductor memory device that eliminates the possibility to increase the height of the wiring lines (e.g., the bit lines) for higher integration, and a method of fabricating the device.

The above objects together with others not specifically mentioned will become clear to those skilled in the art from the following description.

According to a first aspect of the present invention, a semiconductor memory device is provided. This device comprises:

(a) a semiconductor substrate;
(b) a first interlayer dielectric film formed directly on or indirectly over the substrate through at least one film; the first interlayer dielectric film having a surface and contact holes;
(c) first conductive pads formed to fill the respective contact holes of the first interlayer dielectric film;
tops of the first pads being lower than the surface of the first interlayer dielectric film, forming gaps on the tops of the first pads in the respective contact holes of the first interlayer dielectric film;
the gaps being divided into a first group and a second group;
(d) wiring (or conductive) lines formed on the surface of the first interlayer dielectric film;
a top face and side faces of each of the wiring lines being covered with a dielectric;
the wiring lines being divided into a first group and a second group;
the wiring lines of the first group being electrically connected to the respective first conductive pads of the first group;
the wiring lines of the second group being electrically insulated from the respective first conductive pads of the second group;

(e) a second interlayer dielectric film formed on the surface of the first interlayer dielectric film to cover the wiring lines of the first and second groups;
the second interlayer dielectric film having contact holes; and
(f) approximately cylindrical lower capacitor electrodes formed in the respective contact holes of the second interlayer dielectric film;
the lower capacitor electrodes being contacted with the first interlayer dielectric film.

With the semiconductor memory device according to the first aspect of the present invention, the first conductive pads are formed to fill the respective contact holes of the first interlayer dielectric film in such a way that the tops of the first pads are lower than the surface of the first interlayer dielectric film. Thus, the gaps are formed on the tops of the first pads in the respective contact holes.

The wiring (or conductive) lines, the top faces and side faces of which are covered with the dielectric, are formed on the surface of the first interlayer dielectric film. The wiring lines of the first group are electrically connected to the first conductive pads. On the other hand, the wiring lines of the second group are apart from the respective first conductive pads, thereby electrically insulating the wiring lines of the second group from the first conductive pads.

Thus, the electrical short-circuit between the wiring lines of the second group and the respective first conductive pads for electrically connection to the lower capacitor electrodes can be prevented from occurring. This means that reduction of the width of the wiring lines (e.g., the bit lines) is unnecessary for higher integration; in other words, the possibility to increase the height of the wiring lines (e.g., the bit lines) is eliminated for higher integration.

Besides, the wiring lines of the second group are apart from the respective first conductive pads and therefore, the alignment margin between the wiring lines of the second group and the respective first conductive pads for electrically connection to the lower capacitor electrodes is increased.

In a preferred embodiment of the device according to the first aspect of the invention, there are additionally provided with second conductive pads formed to fill the respective gaps of the first group; and
dielectric pads formed to fill the respective gaps of the second group In this embodiment, the dielectric pads are formed to fill the respective gaps of the second group and thus, there is an additional advantage that undesired etching of the wiring lines (e.g., the bit lines) can be prevented when the interlayer dielectric layer is selectively etched to form the contact holes for the lower capacitor electrodes.

In this embodiment, it is preferred that the dielectric pads are made of a same material as the second interlayer dielectric film.

Preferably, the second conductive pads are made of a different material from the first conductive pads, thereby providing a sufficient etch selectivity between the material of the second conductive pads and the conductive pads.

In another preferred embodiment of the device according to the first aspect of the invention, there are additionally provided with dielectric sidewalls formed in the respective gaps of the first interlayer dielectric film in such a way as to inner walls (or inner faces) of the respective contact holes of the first interlayer dielectric film.

According to a second aspect of the present invention, a method of fabricating a semiconductor memory device is provided. This method comprises the steps of:

(a) forming a first interlayer dielectric film directly on or indirectly over a semiconductor substrate through at least one film;
the first interlayer dielectric film having a surface and contact holes;
(b) forming first conductive pads to fill the respective contact holes of the first interlayer dielectric film;
tops of the first pads being lower than the surface of the first interlayer dielectric film, forming gaps on the tops of the first pads in the respective contact holes of the first interlayer dielectric film;
the gaps being divided into a first group and a second group;
(c) forming wiring (or conductive) lines on the surface of the first interlayer dielectric film;
a top face and side faces of each of the wiring lines being covered with a dielectric;
the wiring lines being divided into a first group and a second group;
the wiring lines of the first group being electrically connected to the respective first conductive pads of the first group;
the wiring lines of the second group being electrically insulated from the respective first conductive pads of the second group;
(d) forming a second interlayer dielectric film on the surface of the first interlayer dielectric film to cover the wiring lines of the first and second groups;
(e) selectively etching the second interlayer dielectric film to form contact holes therein; and
(f) forming approximately cylindrical lower capacitor electrodes in the respective contact holes of the second interlayer dielectric film;
the lower capacitor electrodes being contacted with the dielectric covering the wiring lines.

With the method according to the second aspect of the present invention, it is obvious that the device according to the first aspect of the invention is fabricated.

In a preferred embodiment of the method according to the second aspect of the invention, there are additionally provided with the steps of (g) forming second conductive pads to fill the respective gaps of the first and second groups;
(h) removing the second conductive pads in the respective gaps of the second group; and
(i) forming dielectric pads to fill the respective gaps of the second group from which the second conductive pads have been removed. The steps (g), (h) and (i) are carried out between the steps (b) and (c).

In another preferred embodiment of the method according to the second aspect of the invention, there is additionally provided with the step of forming dielectric sidewalls in the respective gaps of the first interlayer dielectric film in such a way as to inner walls (or inner faces) of the respective contact holes of the first interlayer dielectric film

BRIEF DESCRIPTION OF THE DRAWINGS

In order that the present invention may be readily carried into effect, it will now be described with reference to the accompanying drawings.

FIG. 4 is a schematic, partial plan view showing the layout of the respective elements of a semiconductor memory device according to a first embodiment of the invention, which is substantially the same as FIG. 1.

DETAILED DESCRIPTION OF THE PREFERRED EMBODIMENTS

Figure 1:
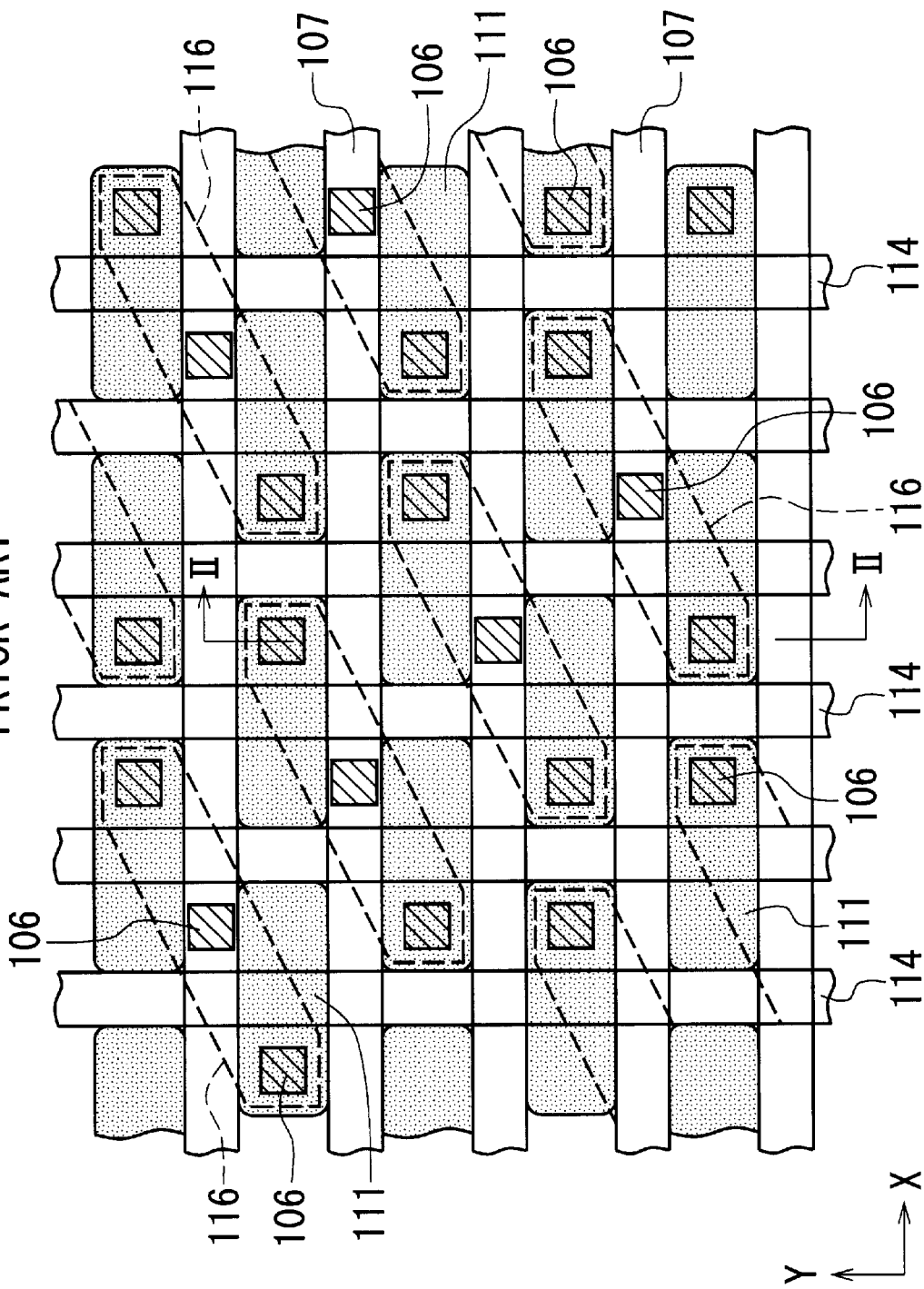
FIG. 1 is a schematic, partial plan view showing the layout of the respective elements of a conventional semiconductor memory device.
Figure 2A:
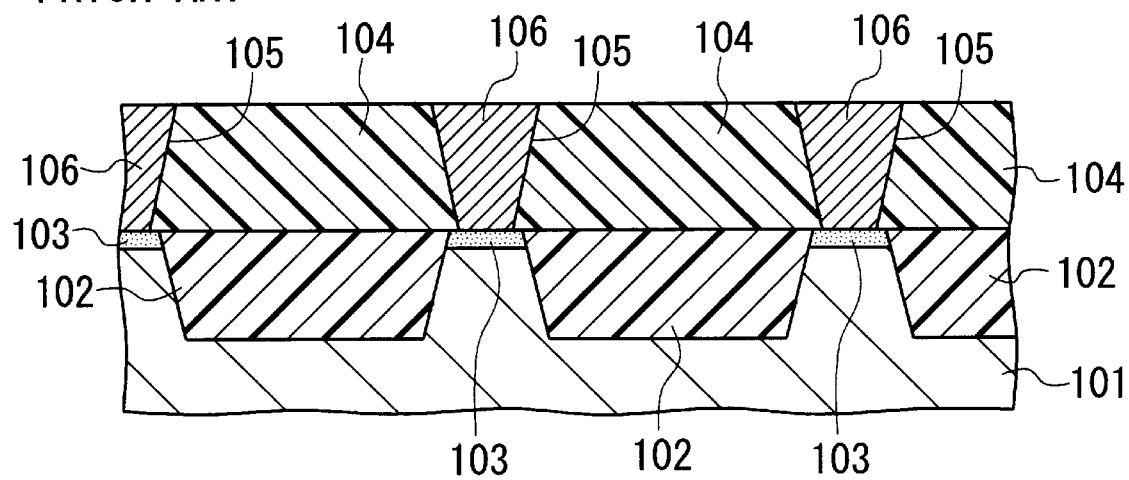
FIGS. 2A to 2D are schematic cross-sectional views showing the process steps of a method of fabricating the conventional semiconductor memory device, respectively.
Figure 2B:
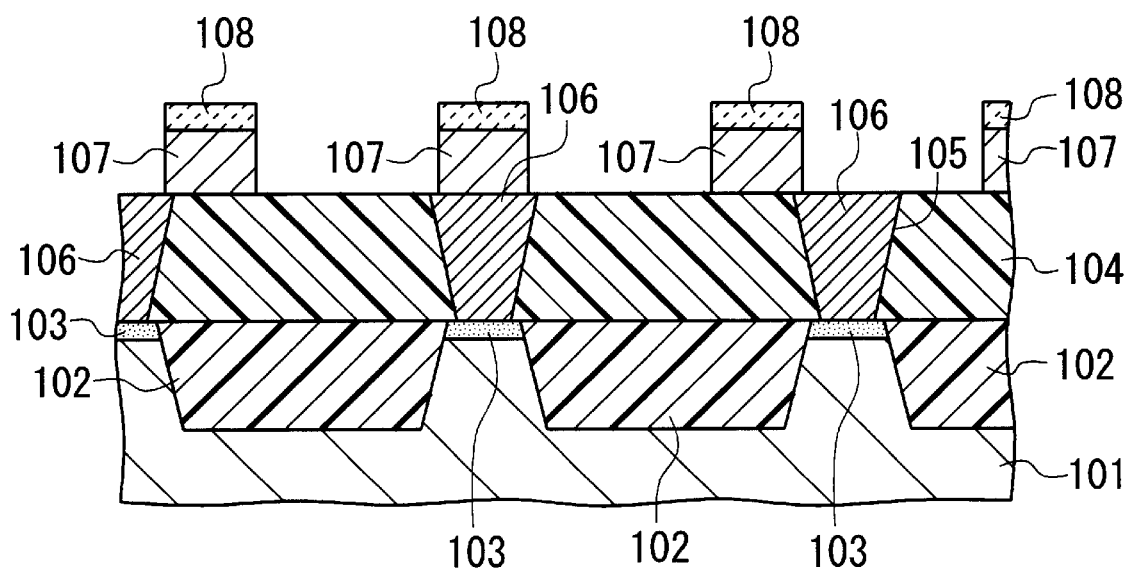
Figure 2C:
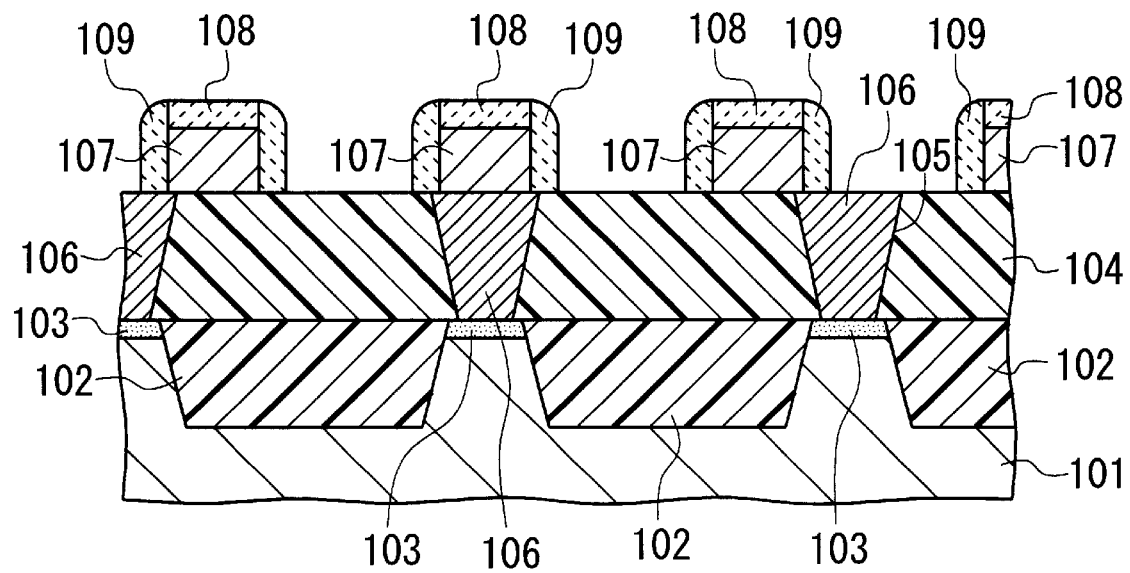
Figure 2D:
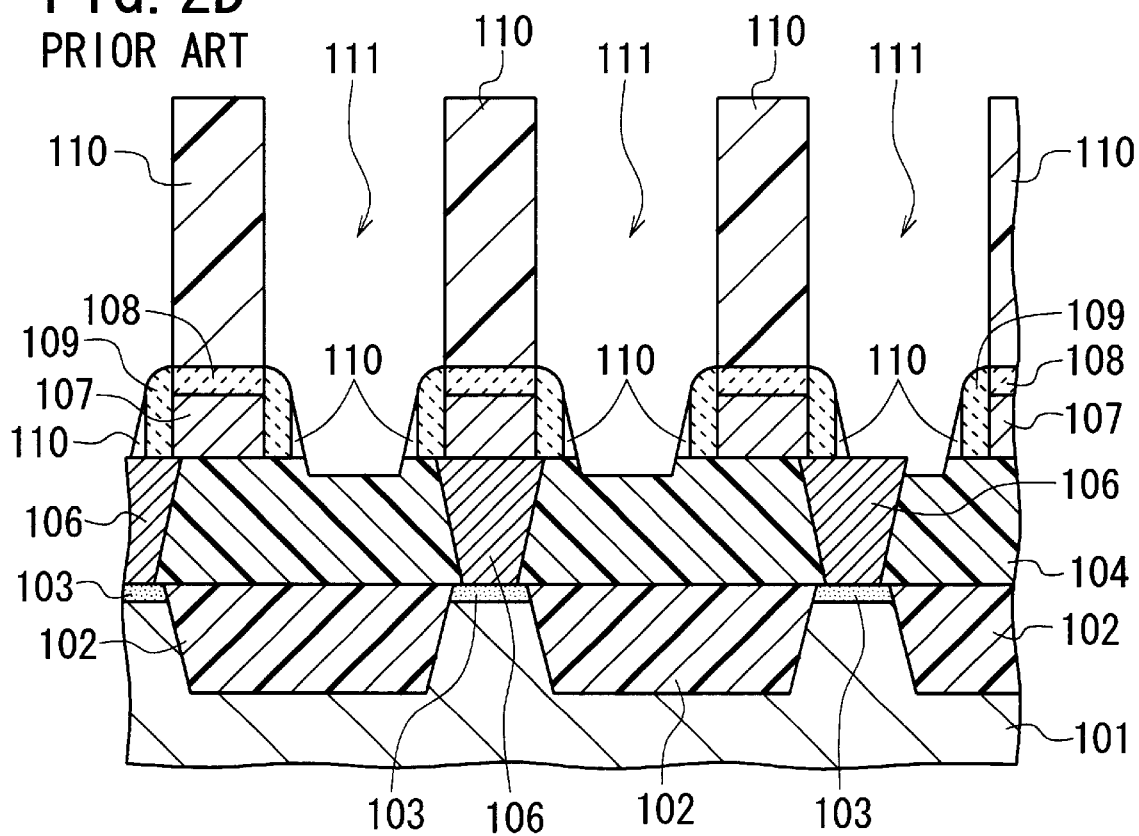
Figure 3A:
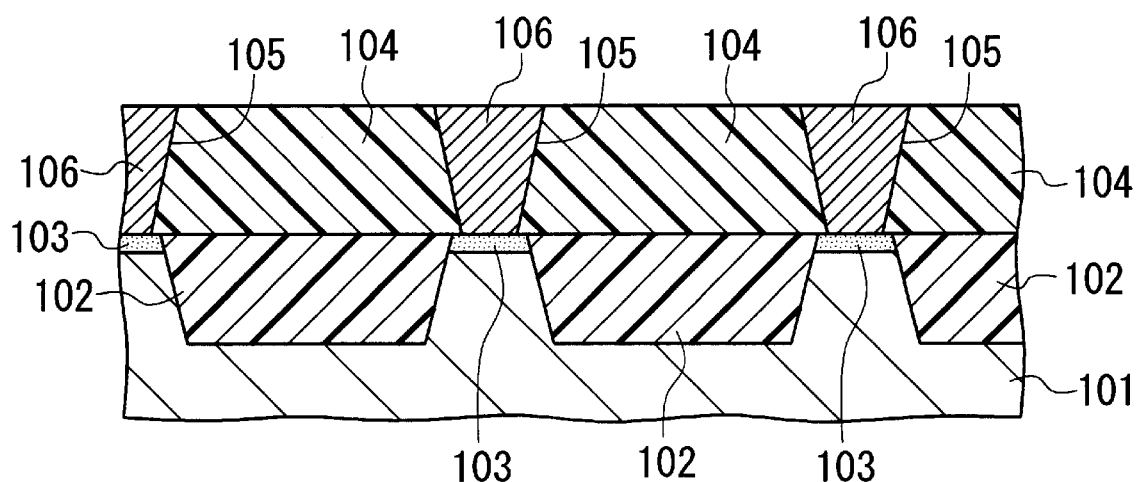
FIGS. 3A to 3D are schematic cross-sectional views showing the process steps of an improved method of fabricating the conventional semiconductor memory device, respectively.
Figure 3B:
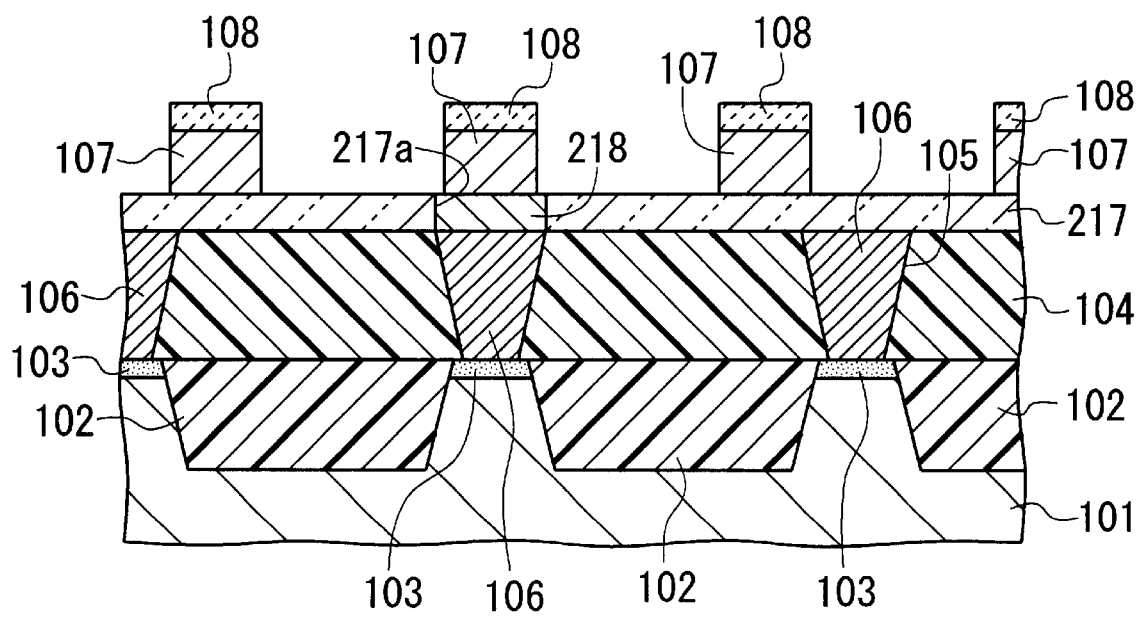
Figure 3C:
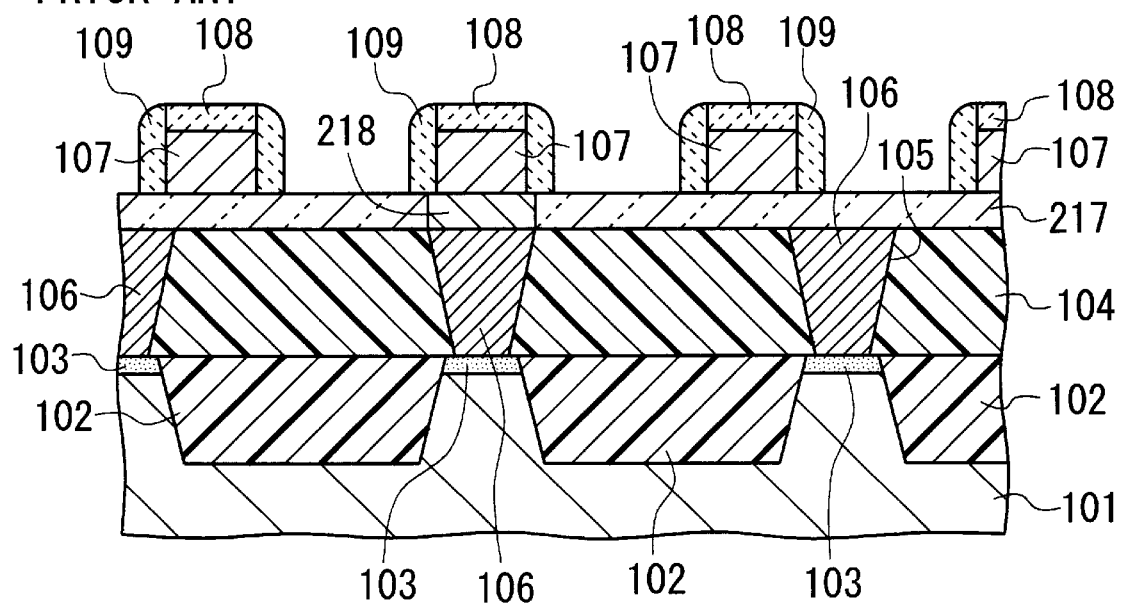
Figure 3D:
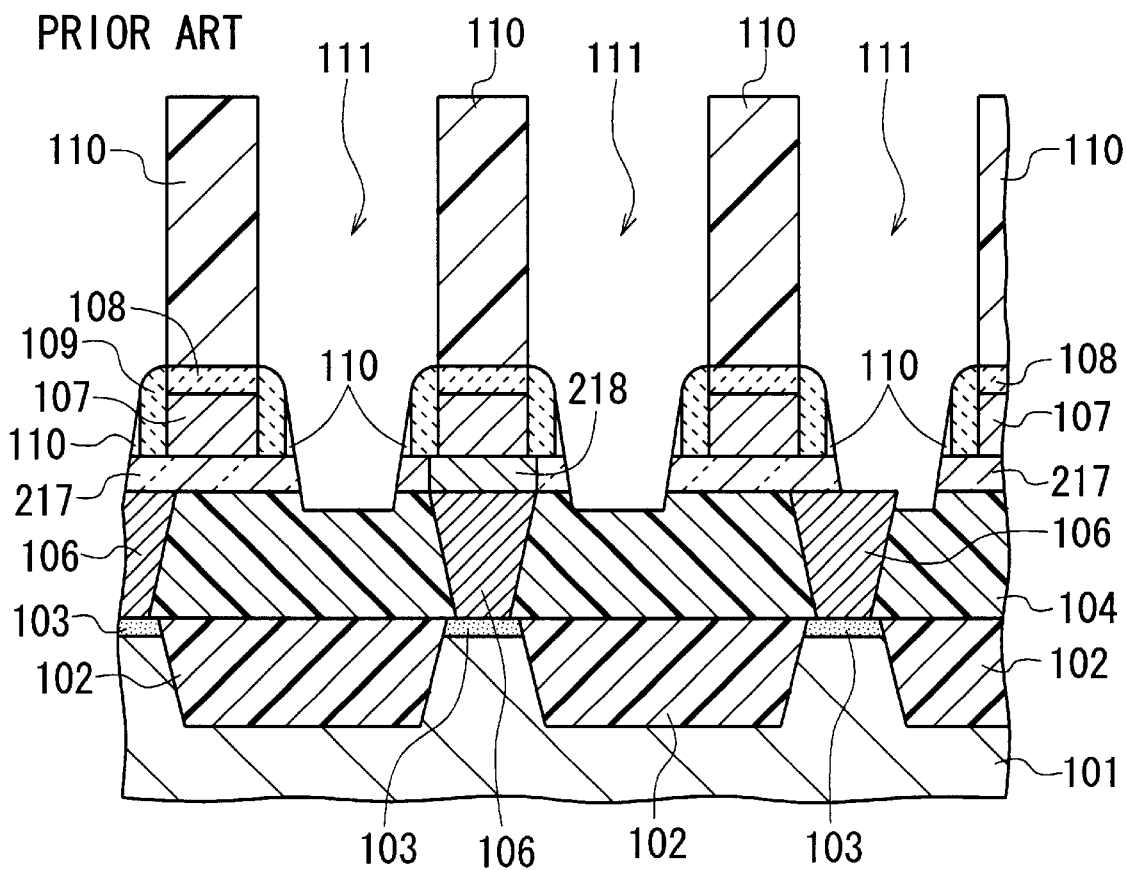

Preferred embodiments of the present invention will be described in detail below while referring to the drawings attached.

FIRST EMBODIMENT

A semiconductor memory device according to a first embodiment of the invention, which is a DRAM with the cylindrical stacked capacitor structure, has a configuration as shown in FIG. 4. Specifically, the device includes active areas 16 formed in a single-crystal silicon (Si) substrate 1. The areas 16 are arranged regularly in a seimconductor substrate 1. Two MOSFETs (not shown) are formed in each of the areas 16. Bit lines 7 and gate electrodes 14 of the MOSFETs are arranged in a matrix array over the substrate 1. The gate electrodes 14 are formed to be consecutive and serve as word lines. The bit lines 7 extend in the X direction while the gate electrodes (i.e., word lines) 14 extend in the Y direction.

Each of the active areas 16 include two source regions and a common drain region of the two adjoining MOSFETs. The common drain region is electrically connected to the overlying, corresponding bit line 7 by way of the contact pad 6. Each of the two source regions is electrically connected to the overlying, lower electrode of the corresponding storage capacitor by way of the corresponding contact pad 6. The electrode has an approximately rectangular pattern (i.e., the plan shape), as shown in FIG. 4.

The semiconductor memory device according to the first embodiment is fabricated in the following way.

Figure 5A:
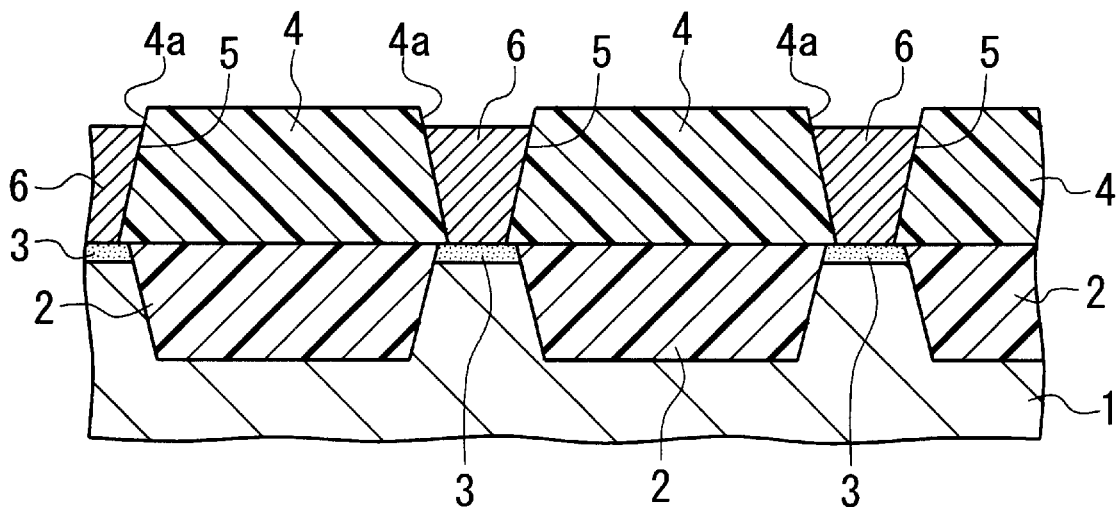
FIGS. 5A to 5G are schematic cross-sectional views showing the process steps of a method of fabricating the semiconductor memory device according to the first embodiment, respectively.

First, as shown in FIG. 5A, an isolation dielectric 2 is selectively formed in the substrate 1 by the known STI method, forming the active areas 16. A specific impurity is selectively ion-implanted into the areas 16, forming the diffusion regions (e.g., source/drain regions) 3. Thereafter, n channel and/or p-channel MOSFETs are formed in the area 16 using the regions 3 through known processes. According to the necessity, channel stop layers (not shown) are additionally formed in the substrate 1 and a specific impurity is ion-implanted into the substrate 1 for adjusting the threshold voltage of the MOSFETs.

Subsequently, a first interlayer dielectric film 4, which is made of BPSG with a thickness of approximately 800 nm, is deposited by a Chemical Vapor Deposition (CVD) process over the whole substrate 1 and then, the surface of the film 4 is planarized by a CMP process. The thickness of the film 4 to be removed by the planarization is set at approximately 400 nm. After a patterned photoresist film (not shown) is formed on the surface of the film 4 thus planarized, the film 4 is selectively etched using the photoresist film as a mask. Thus, contact holes 5 for contact pads are formed over the diffusion regions 3 which will be electrically connected to the overlying bit lines 7 and the overlying lower electrodes 21 of the storage capacitors.

Following this, a polysilicon film (not shown) with a thickness of approximately 500 nm is formed on the first interlayer dielectric film 4 and etched back by a dry etching process, thereby filling polysilicon contact pads 6 in the respective holes 5. The state at this stage is shown in FIG. 5A.

In the etch back process, the etch back time (i.e., the volume of the polysilicon film to be etched back) is adjusted or controlled in such a way that the top of each pad 6 is lower than the surface of the first interlayer dielectric film 4 by a specific value. Thus, small hollow spaces or gaps 4a are formed on the tops of the pads 6 in the holes 5. This is because silicide pads 12 will be formed on the respective polysilicon contact pads 6 in the contact holes 5 in the next process step.

Figure 5B:
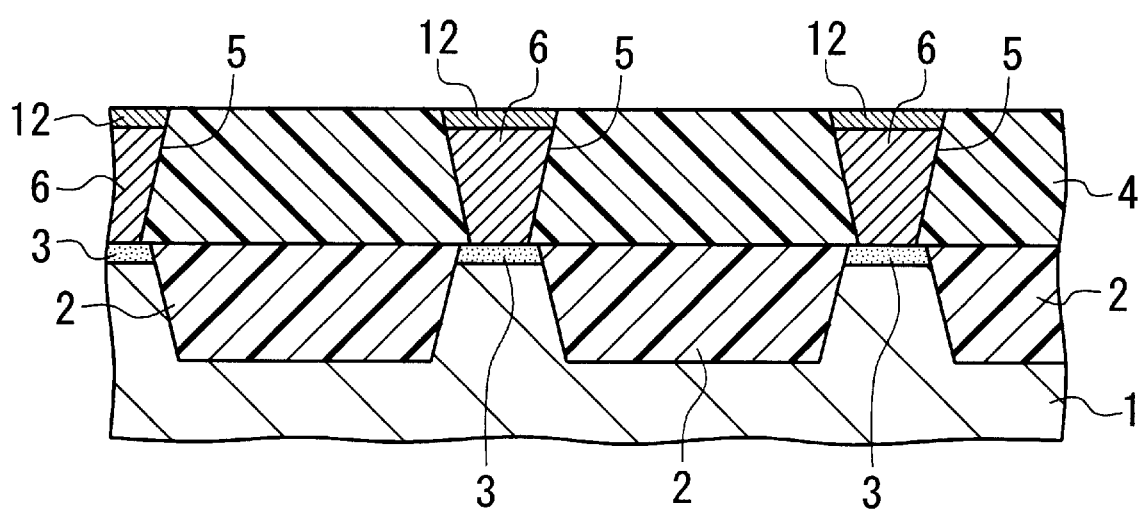

Next, a titanium (Ti) film (not shown) is formed on the first interlayer dielectric film 4 and the polysilicon contact pads 6 by a sputtering process. The titanium film thus formed is subjected to a heat treatment for silicidation reaction with the pads 6 and then, the unreacted titanium film is removed. Thus, the silicide pads 12 are formed in the respective spaces or gaps 4a on the contact pads 6, as shown in FIG. 5B. The top surfaces of the pads 12 are in substantially the same plane as the surface of the film 4. This process is termed the self-aligned silicidation (i.e., SALICIDE) process.

Figure 5C:
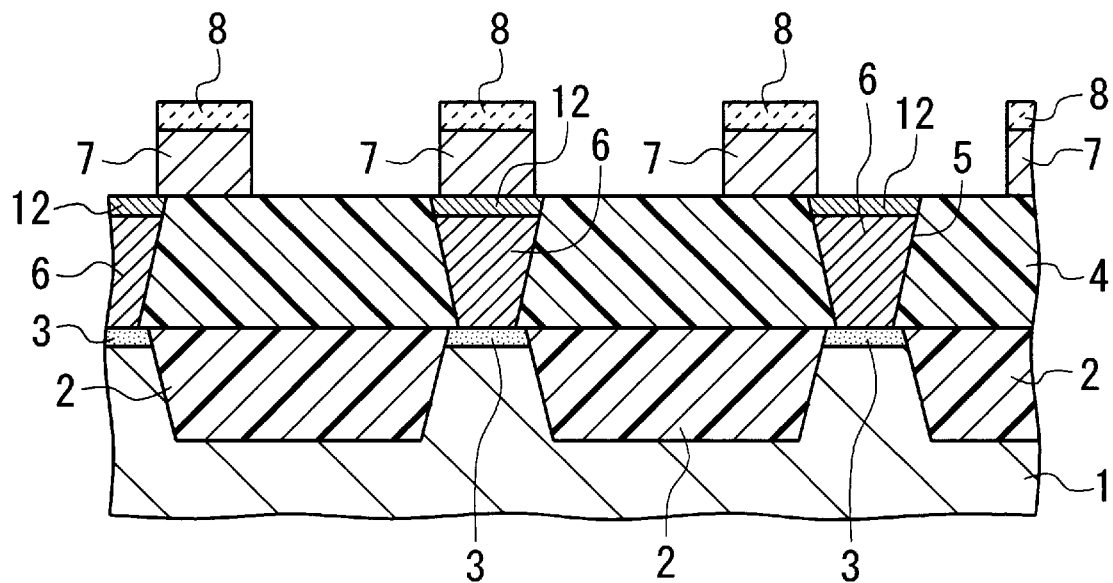

A tungsten (W) polycide film with a thickness of approximately 200 nm and a silicon nitride film with a thickness of approximately 100 nm are successively deposited on the first interlayer dielectric film 4 by known processes such as CVD. A photoresist film (not shown) is formed on the silicon nitride film thus deposited and patterned by a known lithography process. Using the photoresist film thus patterned as a mask, the tungsten polycide film and the silicon nitride film are successively etched, forming the bit lines 7 with the caps 8 on their tops. The bit lines 7 are formed by the tungsten polycide film while the caps 8 are formed by the silicon nitride film. The state at this stage is shown in FIG. 5C.

Figure 5D:
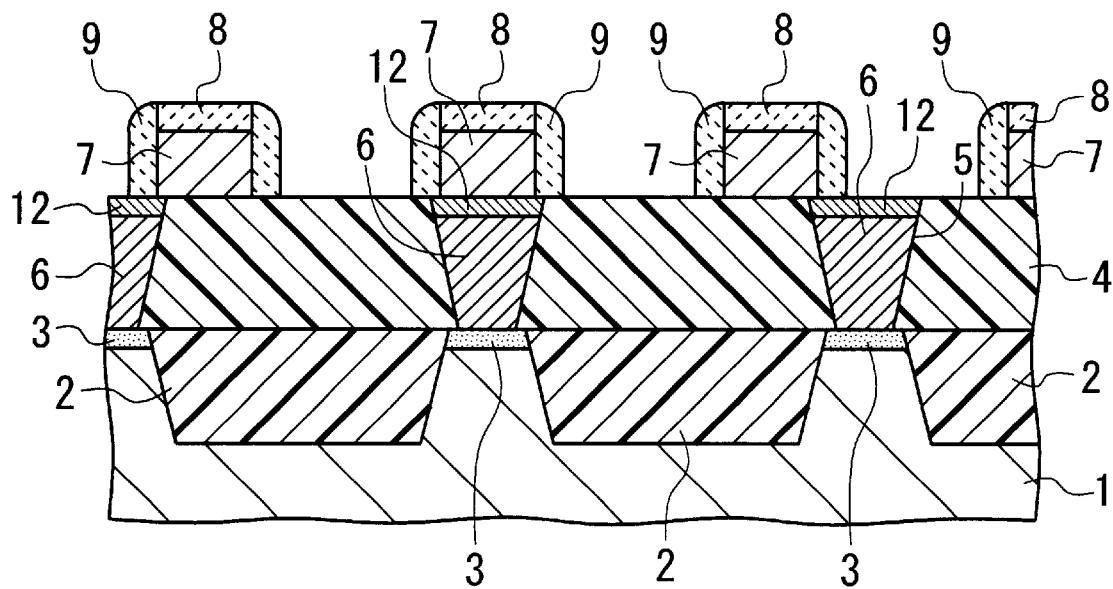

A silicon nitride film with a thickness of approximately 100 nm is deposited on the first interlayer dielectric film 4 to cover the bit lines 7 with the caps 8. The silicon nitride film is then etched back by a dry etching process, forming the sidewalls 9 at both sides of the bit lines 7, as shown in FIG. 5D. Thus, the top and both sides of each bit line 7 are entirely covered with the silicon nitride cap and the silicon nitride sidewalls 9.

Figure 5E:
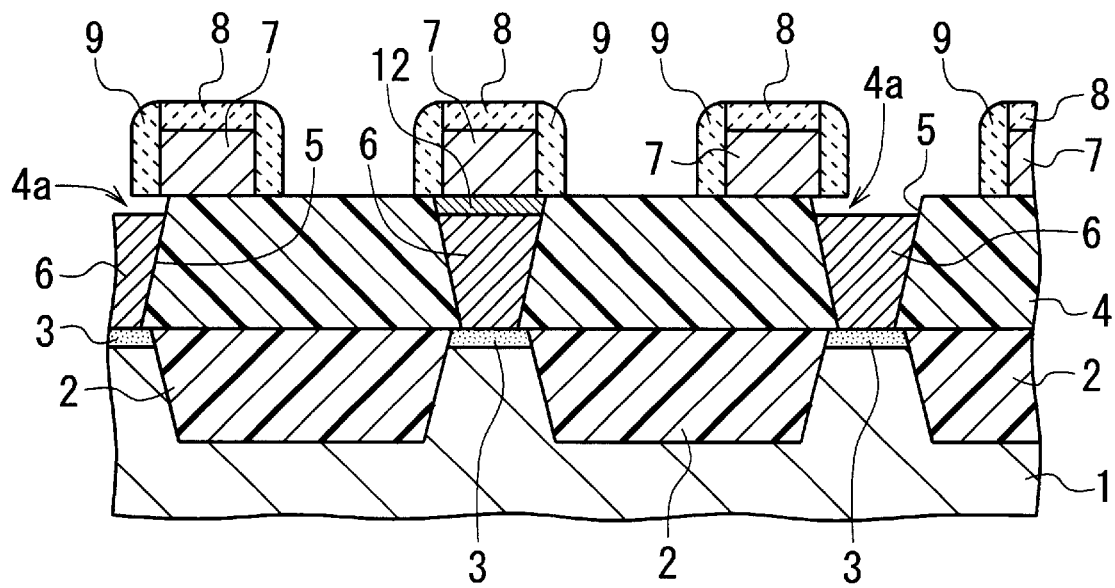

The silicide pads 12 exposed from the bit lines 7 and the sidewalls 8 in the contact holes 5 are selectively removed by an isotrophic etching process (e.g., a wet etching process). Thus, as shown in FIG. 5E, the polysilicon contact pads 6 which are not located just below the bit lines 7 are exposed while the polysilicon contact pads 6 which are located just below the bit lines 7 are not exposed.

A second interlayer dielectric film 10 with a thickness of approximately 1 µm, which is made of silicon dioxide (SiO$_2$), is formed on the first interlayer dielectric film 4 over the substrate 1 to cover the bit lines 7 with the caps 8 and sidewalls 9. At this state, the bottom of the film 10 enters the gaps 4a from which the silicide pads 12 have been removed in the contact holes 5. Thus, the gaps 4a are partially filled with the film 10, which ensures separation of the bit lines 7 from the adjoining pads 6. Then, the surface of the film 10 is planarized by a CMP process.

The second interlayer dielectric film 10 is selectively etched using a patterned photoresist film (not shown) as a mask. Thus, the openings 11 are formed in the film 10 for the lower capacitor electrodes 21. The tops of the pads 6 to be contacted with the electrodes 21 are exposed in the holes 5. This dry etching process is performed under the condition that the etch selectivity is sufficiently high between silicon dioxide (i.e., the film 10) and silicon nitride (i.e., the caps 8 and the sidewalls 9). For example, a gaseous mixture of CHF$_3$ and CO is preferably used for this purpose.

Figure 5F:
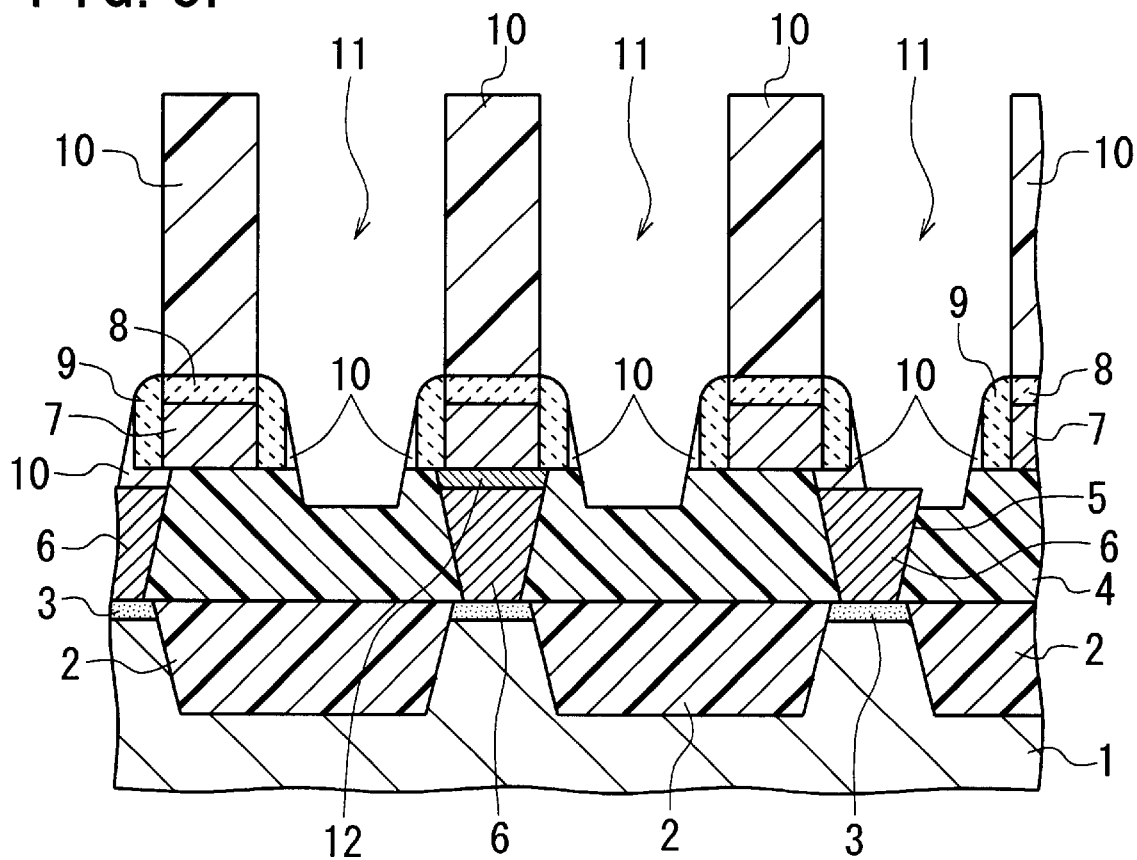

At this time, as seen from FIG. 5F, the silicon dioxide film 10 is left in the gaps 4a from which the silicide pads 12 have been removed in the contact holes 5. Therefore, the polysilicon contact pads 6 are surely separated from the bit lines 7 with the film 10. In other words, electrical short-circuit between the lines 7 and the pads 6 can be prevented from occurring.

Thereafter, a polysilicon film (not shown) with a thickness of approximately 80 nm is deposited on the second interlayer dielectric film 10 to cover the inner and bottom walls of the openings 11 of the film 10. Using a patterned photoresist film as a mask, the polysilicon film thus deposited is selectively etched by a dry etching process, removing the unnecessary polysilicon film on the film 10. Thus, as shown in FIG. 5G, the lower capacitor electrodes 21 are formed in the respective openings 11 to be contacted with the exposed pads 6 in the openings 11.

Figure 5G:
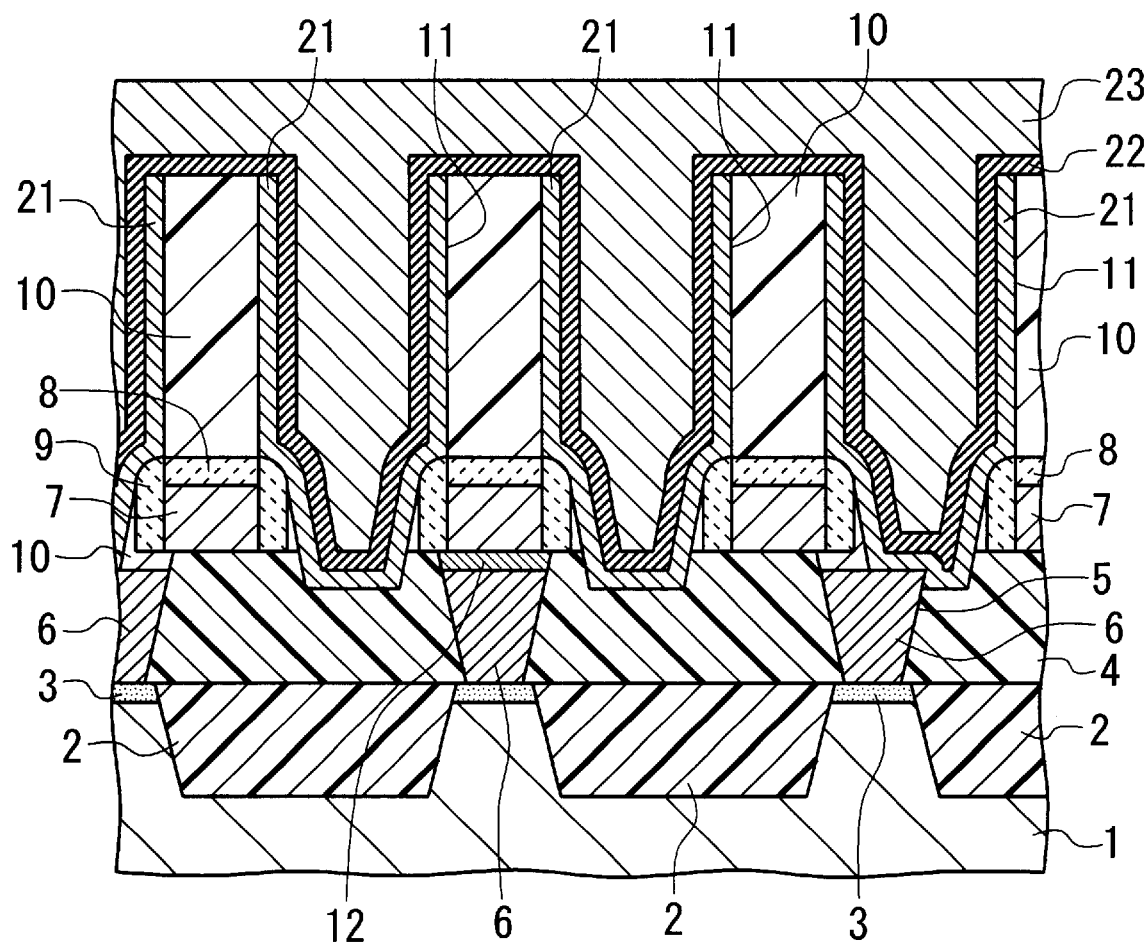

Through known processes, the capacitor dielectric 22 and the common upper capacitor electrode 23 are formed, as shown in FIG. 5G.

With the method of fabricating the semiconductor memory device according to the first embodiment, as explained above, the polysilicon contact pads 6 are formed to fill the respective contact holes 5 of the first interlayer dielectric film 4 in such a way that the tops of the polysilicon pads 6 are lower than the surface of the film 10. Thus, the gaps 4a are formed on the tops of the pads 6 in the respective contact holes 5.

The bit lines 7, the top faces end sides faces of which are covered with the dielectric caps 8 and the dielectric sidewalls 9, are formed on the surface of the first interlayer dielectric film 10. The bit lines 7 located just over the polysilicon pads 6 are electrically connected to the pads 6. On the other hand, the bit lines 7 located not just over the polysilicon pads 6 are apart from the respective pads 6, thereby electrically insulating the bit lines 7 from adjoining the pads 6.

Thus, the electrical short-circuit between the bit lines 7 and the adjoining pads 6 for electrically connection to the lower capacitor electrodes 21 can be prevented from occurring. This means that reduction of the width of the bit lines 7 is unnecessary for higher integration; in other words, the possibility to increase the height of the lines 7 is eliminated for higher integration.

Besides, the bit lines 7 are apart from the adjoining pads 6 and therefore, the alignment margin between the bit lines 7 and the adjoining pads 6 for electrically connection to the lower capacitor electrodes 21 is increased.

Moreover, it is sufficient that the SALICIDE process for forming the silicide pads 12 and the etching process of the pads 12. Therefore, the number of the necessary process steps is smaller than the prior-art method explained with reference to FIGS. 3A to 3D.

In the first embodiment, the titanium silicide pads 12 are formed on the polysilicon contact pads 6 in the holes 5 while the bit lines 7 are formed by the tungsten polycide film. However, the invention is not limited to this case. Any silicide film or cobalt (Co), nickel (Ni), tantalum (Ta), zirconium (Zr), and so on may be used instead of the titanium silicide film. Any conductive film may be used for this purpose if it can be etched at a sufficient selectivity with respect to a polysilicon film. The tungsten polycide film may be replaced with any stacked combination of polysilicon and silicide films or any metal film.

SECOND EMBODIMENT

FIGS. 6A to 6E show a method of fabricating a semiconductor memory device according to a second first embodiment of the invention. Like the first embodiment, the semiconductor device of the second embodiment is a DRAM with the cylindrical stacked capacitor structure and has the same configuration as shown in FIG. 4.

The device of the second embodiment has the same configuration as the first embodiment except that the silicide pads 12 in the gaps 4a are eliminated and that dielectric sidewalls 13 are additionally formed in the gaps 4a on the polysilicon pads 6.

Figure 6A:
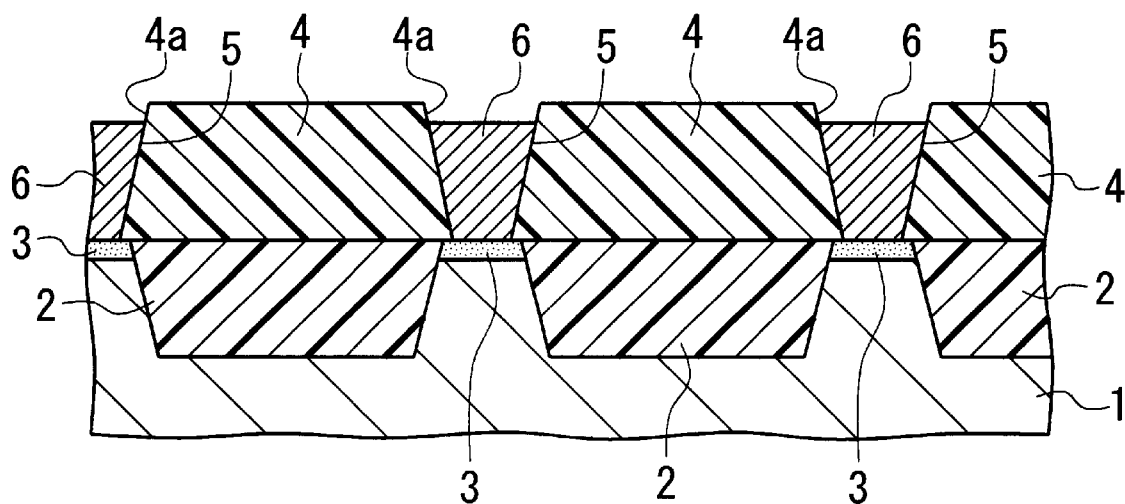
FIGS. 6A to 6E are schematic cross-sectional views showing the process steps of a method of fabricating a semiconductor memory device according to a second embodiment of the invention, respectively.

Specifically, first, as shown in FIG. 6A, an isolation dielectric 2 is selectively formed in the substrate 1 by the STI method, forming the active areas 16. A specific impurity is selectively ion-implanted into the areas 16, forming the diffusion regions 3. Thereafter, necessary MOSFETs are formed in the areas 16 using the regions 3 through known processes.

Subsequently, a first interlayer dielectric film 4, which is made of BPSG with a thickness of approximately 800 nm, is deposited by a CVD process over the whole substrate 1 and then, the surface of the film 4 is planarized by a CMP process by a thickness of approximately 400 nm. Using a patterned photoresist film (not shown) as a mask, the film 4 is selectively etched, forming the contact holes 5 over the diffusion regions 3 which will be electrically connected to the overlying bit lines 7 and the overlying lower electrodes 21 of the storage capacitors.

Following this, a polysilicon film (not shown) with a thickness of approximately 500 nm is formed on the first interlayer dielectric film 4 and etched back, thereby filling the polysilicon contact pads 6 in the respective holes 5. The state at this stage is shown in FIG. 6A. The top of each pad 6 is lower than the surface of the film 4, forming the hollow gaps or spaces 4a on the tops of the pads 6 in the holes 5. This is the same as shown in the first embodiment.

Figure 6B:
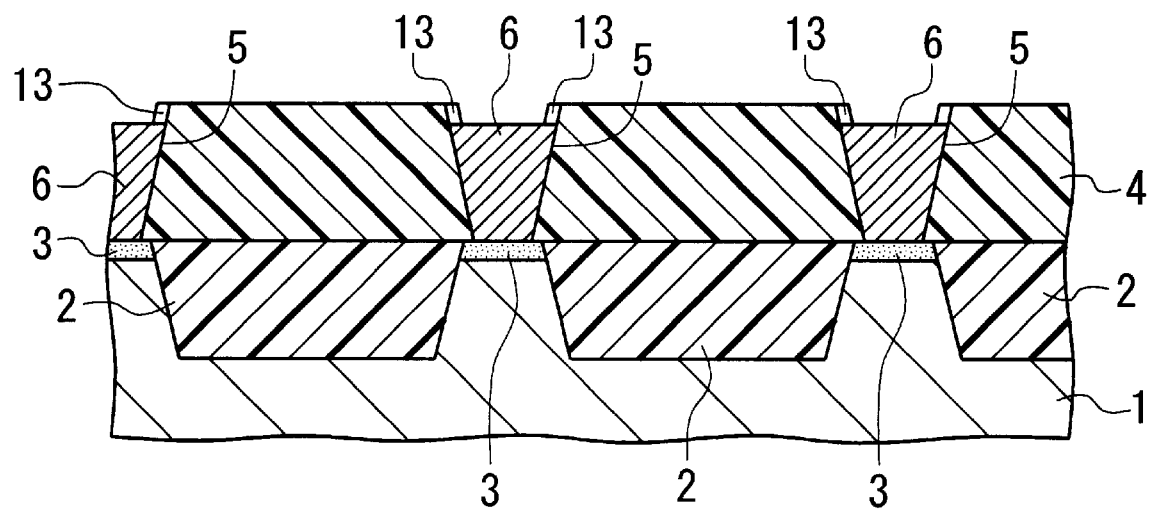

Following this, a silicon dioxide film (not shown) with a thickness of approximately 100 nm is deposited on the first interlayer dielectric film 4 to cover the tops of the pads 6 in the contact holes 5. The silicon dioxide film thus deposited is then etched back by a dry etching process, forming the dielectric sidewalls 13 in the gaps 4a on the respective pads 6, as shown in FIG. 6B. Each of the sidewalls 13 covers the entire inner wall of the gap 4a. The silicide pads 12 are not formed in the gaps 4a. This structure is unlike the above-described first embodiment.

Figure 6C:
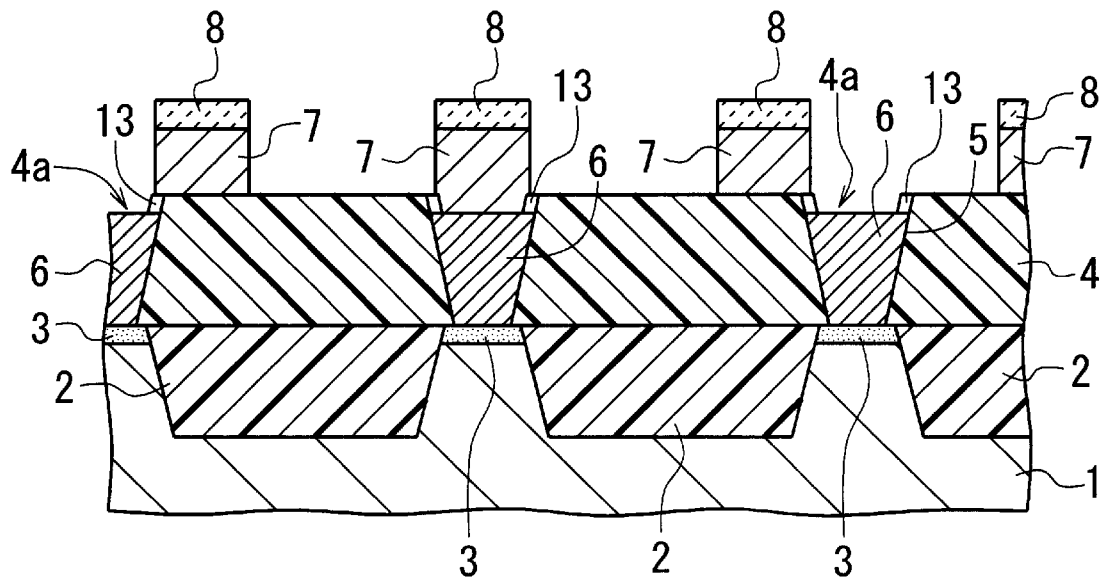

Next, similar to the first embodiment, a tungsten (W) polycide film with a thickness of approximately 200 nm and a silicon nitride film with a thickness of approximately 100 nm are successively deposited on the first interlayer dielectric film 4. Using a patterned photoresist film as a mask, the tungsten polycide film and the silicon nitride film are successively etched, forming the bit lines 7 with the caps 8 on their tops, as shown in FIG. 6C.

Figure 6D:
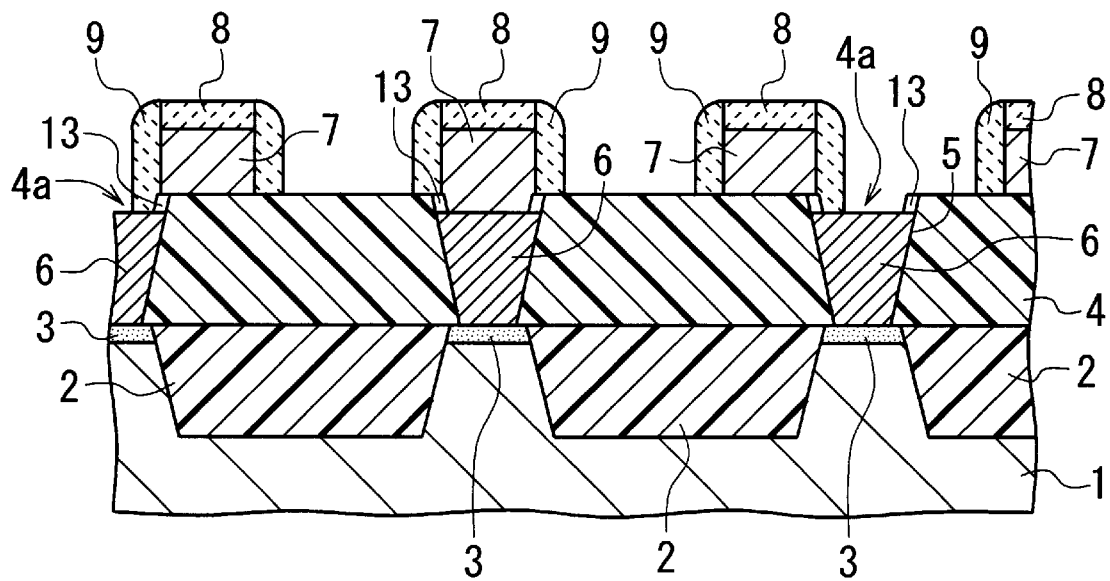

Similar to the first embodiment, a silicon nitride film with a thickness of approximately 100 nm is deposited on the first interlayer dielectric film 4 and then, etched back. Thus, the dielectric sidewalls 9 are formed at both of the bit lines 7, as shown in FIG. 6D.

A second interlayer dielectric film 10 with a thickness of approximately 1 μm, which is made of silicon dioxide ($SiO_2$), is formed on the first interlayer dielectric film 4 over the substrate 1 to cover the bit lines 7 with the caps 8 and sidewalls 9. At this state, the bottom of the film 10 enters the remaining gaps 4a surrounded by the respective sidewalls 13 in the contact holes 5. Thus, the gaps 4a are partially filled with the film 10, which ensures separation of the bit lines 7 from the adjoining pads 6. Then, the surface of the film 10 is planarized by a CMP process.

The second interlayer dielectric film 10 is selectively etched using a patterned photoresist film (not shown) as a mask. Thus, the openings 11 are formed in the film 10 for the lower capacitor electrodes 21. The tops of the pads 6 to be contacted with the electrodes 21 are exposed in the holes 5. This dry etching process is performed under the condition that the etch selectivity is sufficiently high between silicon dioxide (i.e., the film 10) and silicon nitride (i.e., the caps 8 and the sidewalls 9). For example, a gaseous mixture of $C_4F_8$ and CO is preferably used for this purpose.

Figure 6E:
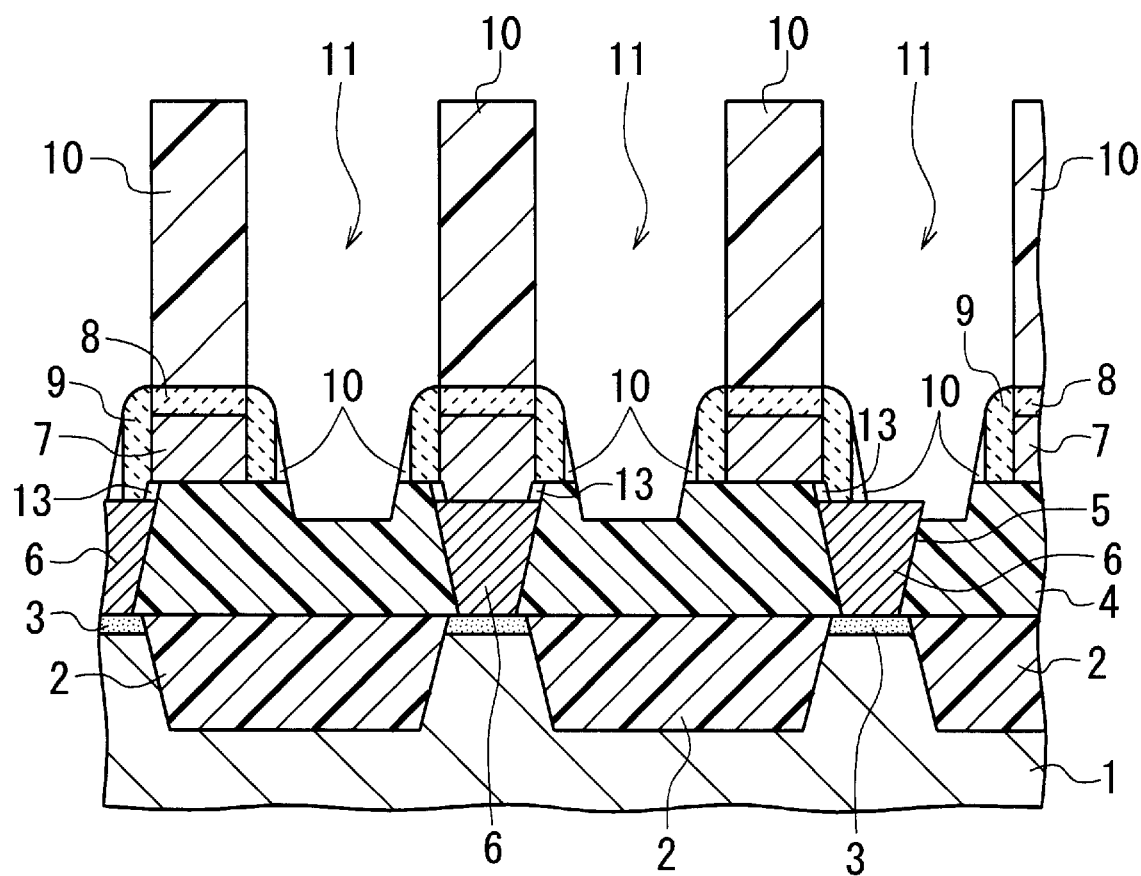

At this time, as seen from FIG. 6E, the silicon dioxide film 10 is left in the gaps 4a. Therefore, the polysilicon contact pads 6 are surely separated from the adjoining bit lines 7 with the film 10. In other words, electrical short-circuit between the lines 7 and the pads 6 can be prevented from occurring.

Thereafter, in the same way as the first embodiment, as shown in FIG. 5G, the lower capacitor electrodes 21 are formed by a polysilicon film in the respective openings 11 to be contacted with the exposed pads 6 in the openings 11. The capacitor dielectric 22 and the common upper capacitor electrode 23 are formed.

With the method of fabricating the semiconductor memory device according to the second embodiment, as explained above, the same advantages as those in the first embodiment are given.

In the second embodiment, the tungsten polycide film may be replaced with any stacked combination of polysilicon and silicide films or any metal film, which is similar to the first embodiment.

THIRD EMBODIMENT

FIGS. 7A to 7G show a method of fabricating a semiconductor memory device according to a third first embodiment of the invention. Like the first embodiment, the semiconductor device of the third embodiment is a DRAM with the cylindrical stacked capacitor structure and has the same configuration as shown in FIG. 4.

The device of the third embodiment has the same configuration as the first embodiment except that the silicide pads 12 shown in the first embodiment and the dielectric sidewalls 13 shown in the second embodiment are additionally formed in the gaps 4a on the polysilicon pads 6 in the contact holes 5.

Figure 7A:
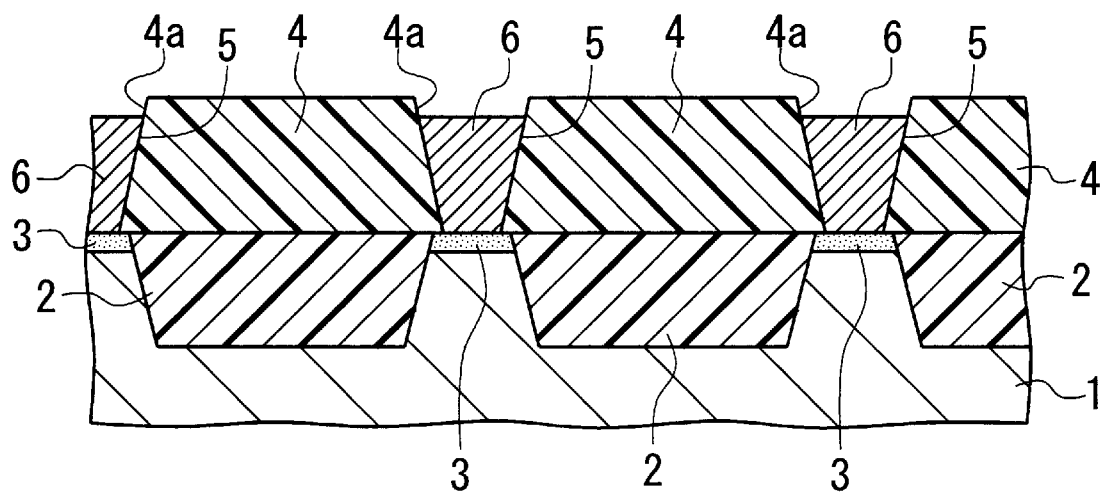
FIGS. 7A to 7G are schematic cross-sectional views showing the process steps of a method of fabricating a semiconductor memory device according to a third embodiment of the invention, respectively.

Specifically, in the same way as the first embodiment, the structure shown in FIG. 7A is formed, where the top of each contact pad 6 is lower than the surface of the first interlayer dielectric film 4, forming the hollow gaps or spaces 4a on the tops of the pads 6. The state shown in FIG. 7A is the same as shown in FIG. 5A.

Figure 7B:
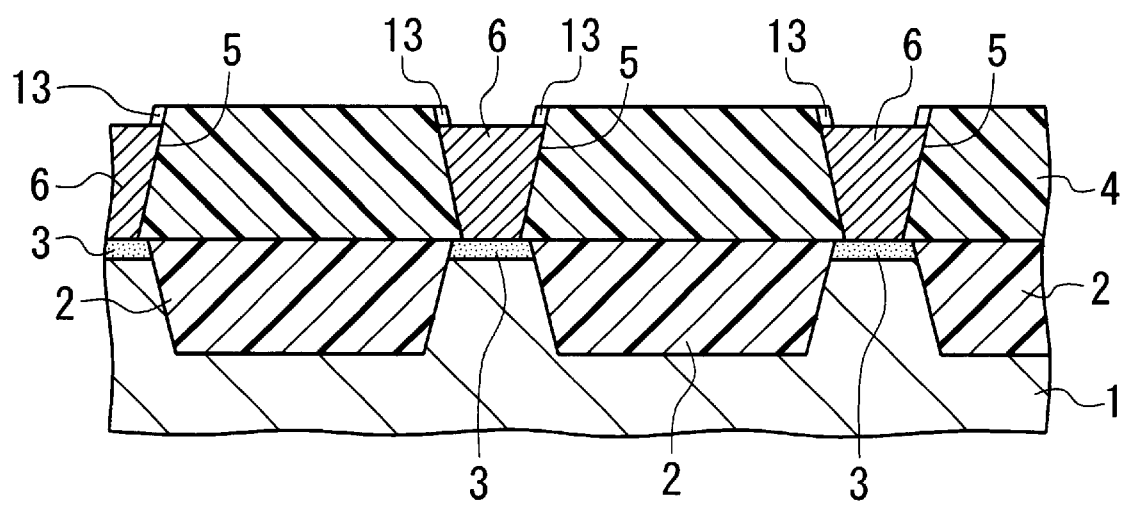

Following this, similar to the second embodiment, a silicon dioxide film (not shown) with a thickness of approximately 100 nm is deposited on the first interlayer dielectric film 4 to cover the tops of the pads 6 in the contact holes 5. The silicon dioxide film thus deposited is then etched back by a dry etching process, forming the dielectric sidewalls 13 in the gaps 4a on the respective pads 6, as shown in FIG. 7B. Each of the sidewalls 13 covers the entire inner wall of the gap 4a.

Figure 7C:
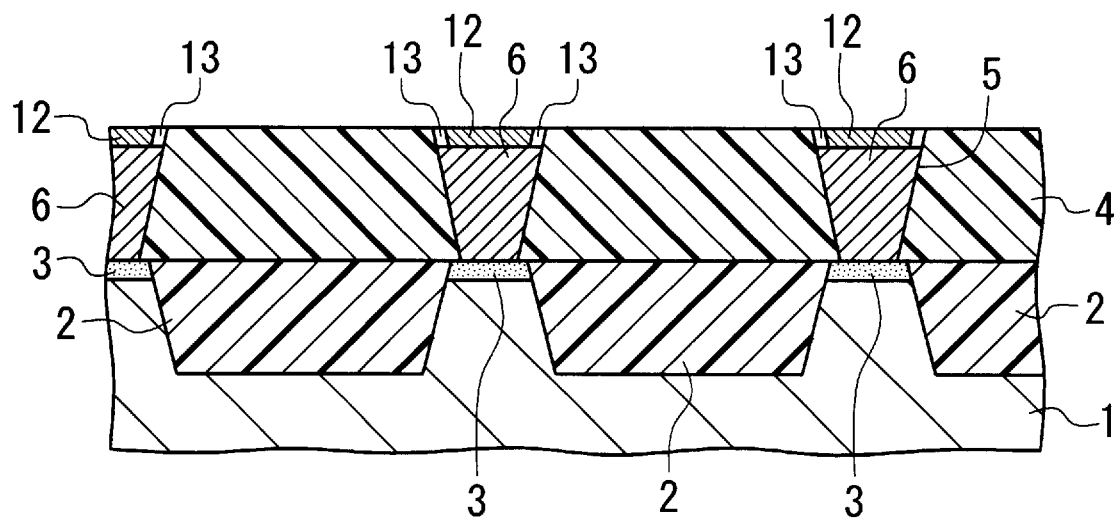

Next, similar to the first embodiment, a polysilicon film (not shown) with a thickness of approximately 500 nm is formed on the first interlayer dielectric film 4 and etched back by a dry etching process, thereby filling the polysilicon contact pads 6 in the respective holes 5. Thereafter, a titanium (Ti) film (not shown) is formed on the first interlayer dielectric film 4 and the polysilicon contact pads 6 by a sputtering process and is subjected to a heat treatment for silicidation reaction. The unreacted titanium film is removed. Thus, the silicide pads 12 are formed on the contact pads 6 in the holes 5, as shown in FIG. 7C. The top surfaces of the pads 12 and the sidewalls 13 are in substantially the same plane as the surface of the film 4.

Figure 7D:
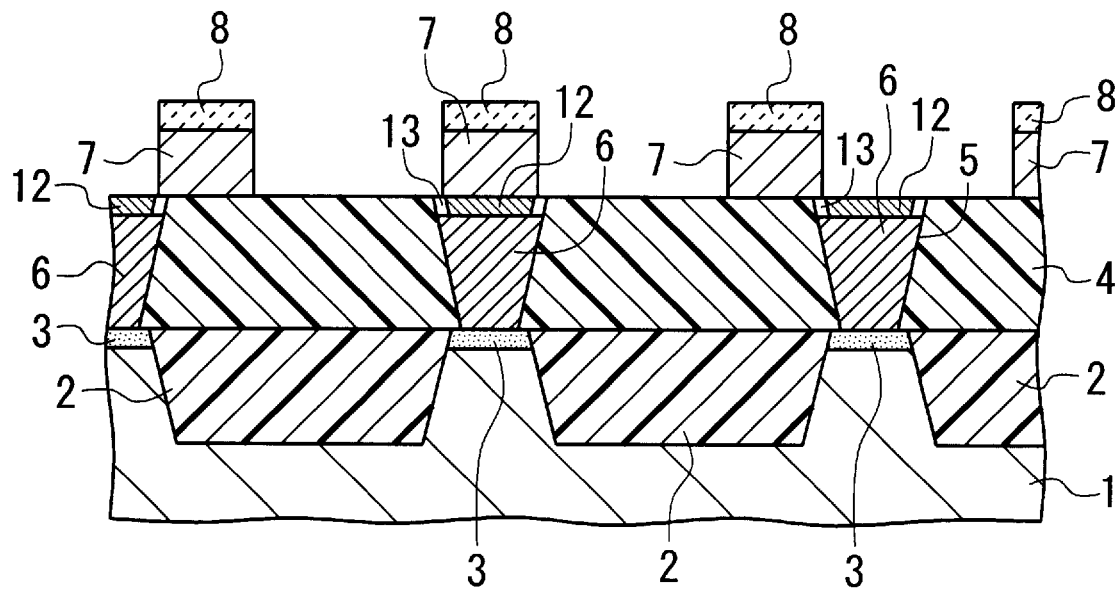
Figure 7E:
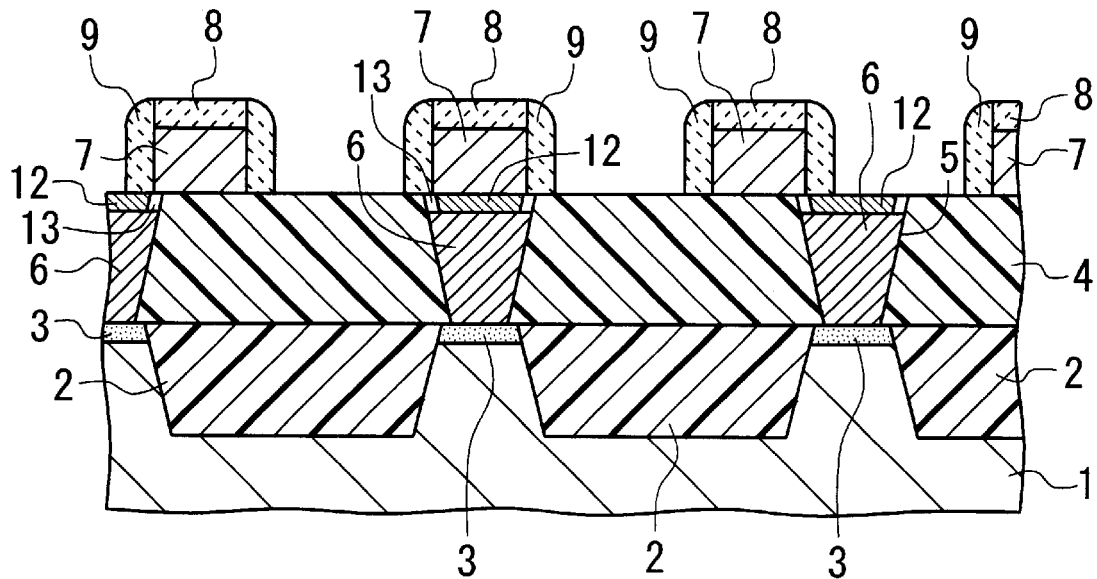

In the same way as the first embodiment, the bit lines 7 with the caps 8 are formed and then, the dielectric sidewalls 9 are formed at both sides of the bit lines 7, as shown in FIGS. 7D and 7E.

Figure 7F:
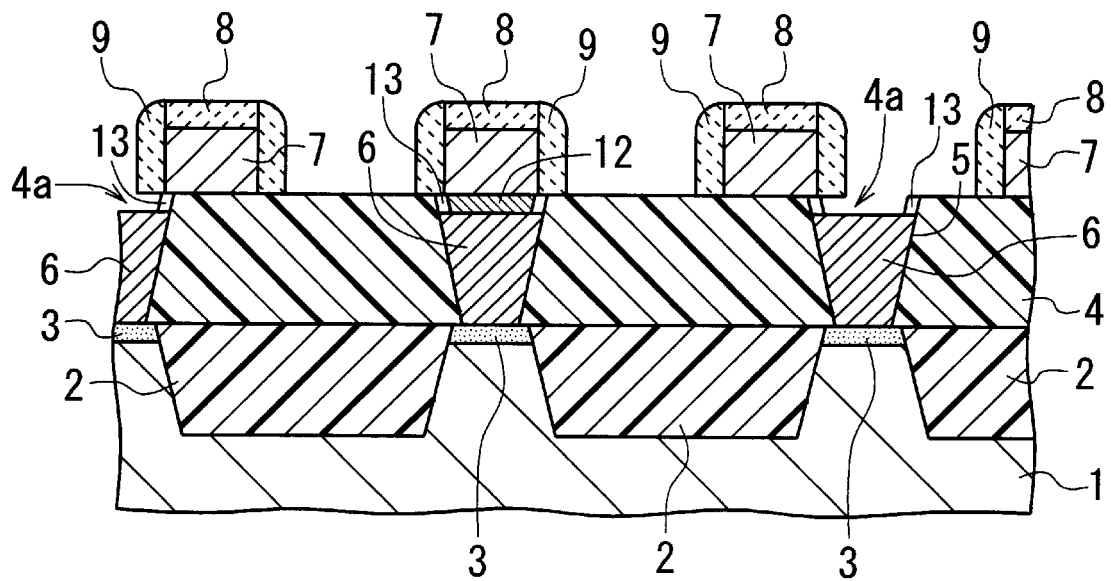
Figure 7G:
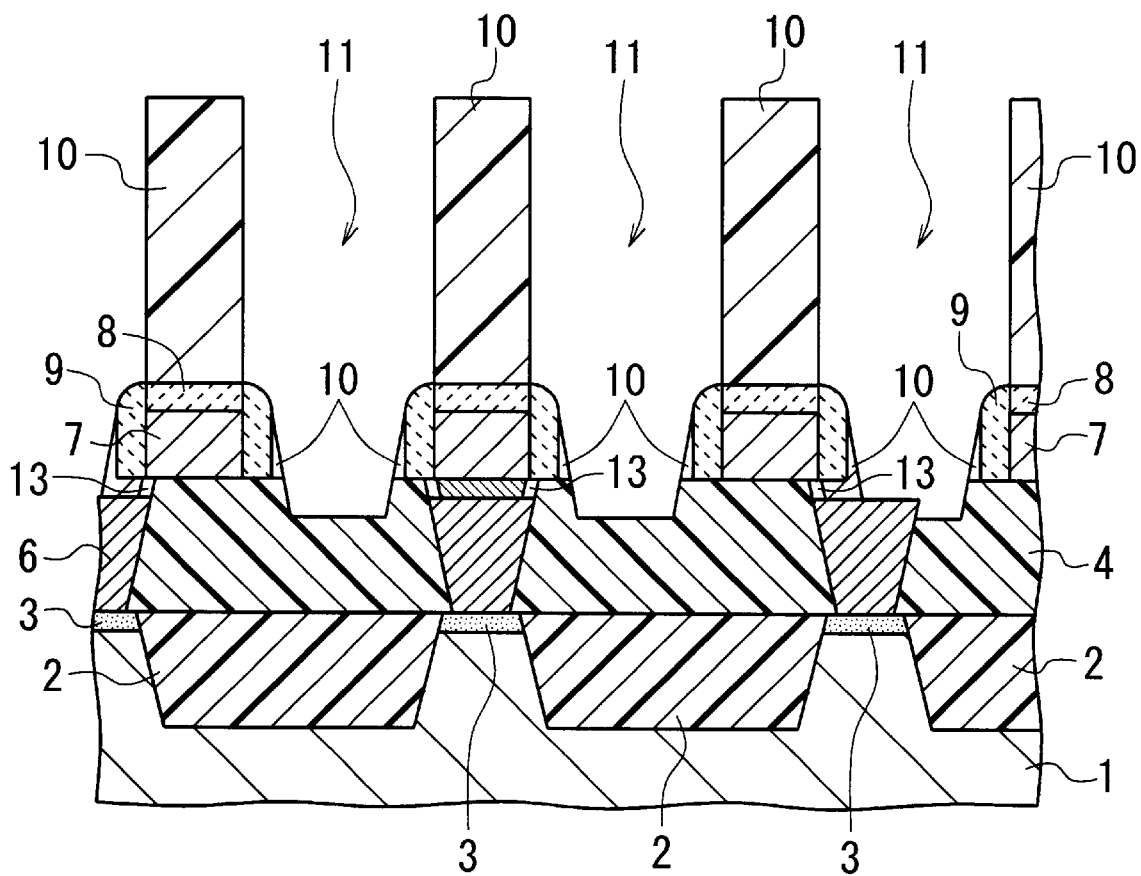

Next, similar to the first embodiment, the silicide pads 12 exposed from the bit lines 7 and the sidewalls 8 in the contact holes 5 are selectively removed by an isotropic etching process (e.g., a wet etching process). Thus, as shown in FIG. 7F, the polysilicon contact pads 6 which are not located just below the bit lines 7 are exposed while the polysilicon contact pads 6 which are located just below the bit lines 7 are not exposed. The sidewalls 13 are left even after the isotropic etching process.

Furthermore, similar to the first embodiment, a second interlayer dielectric film 10 with a thickness of approximately 1 μm, which is made of silicon dioxide ($SiO_2$), is formed on the first interlayer dielectric film 4 to cover the bit lines 7 with the caps 8 and the sidewalls 9. The bottom of the film 10 enters the remaining gaps 4a surrounded by the respective sidewalls 13 in the contact holes 5. Thus, the gaps 4a are partially filled with the film 10, which ensures separation of the bit lines 7 from the adjoining pads 6. Then, the surface of the film 10 is planarized by a CMP process.

Thereafter, the second interlayer dielectric film 10 is selectively etched, forming the openings 11 in the film 10 for the lower capacitor electrodes 21. The tops of the pads 6 to be contacted with the electrodes 21 are exposed in the holes 5. This dry etching process is performed under the same condition as shown in the first embodiment.

In the same way as the first embodiment, as shown in FIG. 5G, the lower capacitor electrode 21, the capacitor dielectrics 22, and the common upper capacitor electrode 23 are formed.

With the method of fabricating the semiconductor memory device according to the third embodiment, as explained above, the same advantages as those in the first embodiment are given.

In the third embodiment, like the first and second embodiments, any silicide film of cobalt (Co), nickel (Ni), tantalum (Ta), zirconium (Zr), and so on may be used instead of the titanium silicide film. Any conductive film may be used for this purpose if it can be etched at a sufficient selectivity with respect to a polysilicon film. The tungsten polycide film may be replaced with any stacked combination of polysilicon and silicide films or any metal film.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of fabricating a semiconductor memory device, comprising the steps of:

(a) forming a first interlayer dielectric film directly on or indirectly over a semiconductor substrate through at least one film;
   the first interlayer dielectric film having a surface;
   the first interlayer dielectric film having contact holes;

(b) forming first conductive pads to fill the respective contact holes of the first interlayer dielectric film;
   tops of the first pads being lower than the surface of the first interlayer dielectric film, forming gaps on the tops of the first pads in the respective contact holes of the first interlayer dielectric film;
   the gaps being divided into a first group and a second group;

(c) forming wiring (or conductive) lines on the surface of the first interlayer dielectric film;
   a top face and side faces of each of the wiring lines being covered with a dielectric;
   the wiring lines being divided into a first group and a second group;
   the wiring lines of the first group being electrically connected to the respective first conductive pads of the first group;
   the wiring lines of the second group being electrically insulated from the respective first conductive pads of the second group;

(d) forming a second interlayer dielectric film on the surface of the first interlayer dielectric film to cover the wiring lines;
   the second interlayer dielectric film having contact holes; and (e) selectively etching the second interlayer dielectric film to form contact holes therein; and (f) forming approximately cylindrical lower capacitor electrodes in the respective contact holes of the second interlayer dielectric film;
   the lower capacitor electrodes being contacted with the dielectric covering the wiring lines.

2. The method according to claim 1, further comprising the steps of (g) forming second conductive pads to fill the respective gaps of the first and second groups;

(h) removing the second conductive pads in the respective gaps of the second group; and (i) forming dielectric pads to fill the respective gaps of the second group from which the second conductive pads have been removed;

wherein the steps (g), (h) and (i) are carried out between the steps (b) and (c).

3. The method according to claim 2, wherein the dielectric pads are made of a same material as the second interlayer dielectric film.

4. The method according to claim 2, wherein the second conductive pads are made of a different material from the first conductive pads, thereby providing a sufficient etch selectivity between the materials of the second conductive pads and the first conductive pads.

5. The method according to claim 2, wherein the first conductive pads are made of polysilicon and the second conductive pads are made of a silicide film of one selected from the group consisting of titanium, cobalt, nickel, tantalum, and zirconium.

6. The method according to claim 2, wherein the first conductive pads are made of polysilicon and the second conductive pads are made of a silicide film of one selected from the group consisting of titanium, cobalt, nickel, tantalum, and zirconium;
   and wherein the dielectric sidewalls are made of oxide of silicon.

7. The method according to claim 2, wherein the first conductive pads are made of polysilicon, the first interlayer dielectric film is made of PBSG, and the second conductive pads are made of a silicide film of one selected from the group consisting of titanium, cobalt, nickel, tantalum, and zirconium;
   and wherein the dielectric sidewalls are made of oxide of silicon;
   and wherein the dielectric covering the top face and side faces of the wiring lines is nitride of silicon.

8. The method according to claim 1, wherein the wiring lines are formed by a combination of a polysilicon subfilm and a silicide subfilm stacked with each other.

9. The method according to claim 1, wherein the wiring lines includes a metal subfilm.

* * * * *